(12) United States Patent
Muri et al.

(10) Patent No.: US 10,714,377 B2
(45) Date of Patent: Jul. 14, 2020

(54) SEMICONDUCTOR DEVICE AND SEMICONDUCTOR WAFER INCLUDING A POROUS LAYER AND METHOD OF MANUFACTURING

(71) Applicant: Infineon Technologies AG, Neubiberg (DE)

(72) Inventors: Ingo Muri, Villach (AT); Bernhard Goller, Villach (AT); Iris Moder, Villach (AT); Hans-Joachim Schulze, Taufkirchen (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 16/122,456

(22) Filed: Sep. 5, 2018

(65) Prior Publication Data

US 2019/0074212 A1    Mar. 7, 2019

(30) Foreign Application Priority Data

Sep. 6, 2017  (DE) .................. 10 2017 120 535

(51) Int. Cl.
*H01L 21/762*   (2006.01)
*H01L 29/861*   (2006.01)
(Continued)

(52) U.S. Cl.
CPC .. *H01L 21/76245* (2013.01); *H01L 21/02238* (2013.01); *H01L 21/02494* (2013.01); *H01L 21/02532* (2013.01); *H01L 21/306* (2013.01); *H01L 21/30625* (2013.01); *H01L 22/26* (2013.01); *H01L 23/562* (2013.01);
(Continued)

(58) Field of Classification Search
CPC ......... H01L 21/76245; H01L 21/02258; H01L 21/266; H01L 21/02238; H01L 21/02255; H01L 21/0223; H01L 21/164; H01L 21/3165; H01L 21/32105; H01L 21/31675; H01L 21/322; H01L 21/02203; H01L 21/31695
See application file for complete search history.

(56) References Cited

U.S. PATENT DOCUMENTS 7,743,503 B2 *   6/2010   Okabe ............... B41J 2/161
                                                                         216/27
2004/0058555 A1   3/2004   Moriceau et al.

OTHER PUBLICATIONS

Romanov, S.I., et al., "Homoepitaxy on Porous Silicon with a Buried Oxide Layer: Full-Wafer Scale SOI", Perspectives, Science and Technologies for Novel Silicon on Insulator Devices, 2000, pp. 29-46.

(Continued)

*Primary Examiner* — Hsien Ming Lee
(74) *Attorney, Agent, or Firm* — Murphy, Bilak & Homiller, PLLC

(57) ABSTRACT

A method of manufacturing a semiconductor device includes forming an auxiliary mask including a plurality of mask openings on a main surface of a crystalline semiconductor substrate. A porous structure is formed in the semiconductor substrate. The porous structure includes a porous layer at a distance to the main surface and porous columns that extend from the porous layer into direction of the main surface and that are laterally separated from each other by a non-porous portion. A non-porous device layer is formed on the non-porous portion and on the porous columns.

39 Claims, 20 Drawing Sheets

(51) Int. Cl.
*H01L 21/306* (2006.01)
*H01L 29/66* (2006.01)
*H01L 29/739* (2006.01)
*H01L 29/78* (2006.01)
*H01L 29/08* (2006.01)
*H01L 29/32* (2006.01)
*H01L 21/02* (2006.01)
*H01L 21/66* (2006.01)
*H01L 23/00* (2006.01)
*H01L 29/06* (2006.01)
*H01L 29/16* (2006.01)
*H01L 21/265* (2006.01)
*H01L 21/266* (2006.01)
*H01L 21/84* (2006.01)
*H01L 27/12* (2006.01)
*H01L 29/10* (2006.01)
*H01L 29/423* (2006.01)

(52) U.S. Cl.
CPC ...... *H01L 29/0692* (2013.01); *H01L 29/0834* (2013.01); *H01L 29/32* (2013.01); *H01L 29/66128* (2013.01); *H01L 29/66333* (2013.01); *H01L 29/66348* (2013.01); *H01L 29/66734* (2013.01); *H01L 29/7397* (2013.01); *H01L 29/7813* (2013.01); *H01L 29/8611* (2013.01); *H01L 21/02255* (2013.01); *H01L 21/02258* (2013.01); *H01L 21/02513* (2013.01); *H01L 21/266* (2013.01); *H01L 21/26513* (2013.01); *H01L 21/84* (2013.01); *H01L 27/1203* (2013.01); *H01L 29/0634* (2013.01); *H01L 29/0696* (2013.01); *H01L 29/1095* (2013.01); *H01L 29/1608* (2013.01); *H01L 29/4236* (2013.01); *H01L 29/6606* (2013.01); *H01L 29/7391* (2013.01); *H01L 29/7394* (2013.01); *H01L 29/7395* (2013.01); *H01L 29/7811* (2013.01); *H01L 29/7812* (2013.01)

(56) References Cited

OTHER PUBLICATIONS

Tsao, Sylvia S., "Porous Silicon Techniques for SOI Structures", IEEE Circuits and Devices Magazine, vol. 3, Issue 6, Nov. 1987.

* cited by examiner

SEMICONDUCTOR DEVICE AND SEMICONDUCTOR WAFER INCLUDING A POROUS LAYER AND METHOD OF MANUFACTURING

BACKGROUND

Porous silicon forms by generating pores in the nanometer and micrometer scale in a silicon crystal. Porous silicon layers may be used, e.g., as precursor to generate thick buried oxide layers for SOI (silicon-on-insulator) devices, wherein by proper control of pore density and pore microstructure, the porous silicon can accommodate the volume increase resulting from the incorporation of oxygen during oxidation. Typically porous silicon is formed below and between laterally separated crystalline regions, in which semiconductor devices are formed. Alternatively, semiconductor devices are formed in a non-porous crystalline epitaxial layer formed by epitaxy on a previously formed porous silicon layer.

There is a need for further methods of forming porous layers and buried oxide layers in silicon.

SUMMARY

The present disclosure relates to a method of manufacturing semiconductor devices. An auxiliary mask including a plurality of mask openings is formed on a main surface of a crystalline semiconductor substrate. A porous structure is formed in the semiconductor substrate, wherein the porous structure includes a porous layer at a distance to the main surface and porous columns protruding from the porous layer in direction of the main surface. A non-porous portion laterally separates the porous columns from each other. A non-porous device layer is formed on the non-porous portion and on the porous columns.

The present disclosure further relates to a semiconductor substrate. The semiconductor substrate includes a porous layer at a distance to a main surface of the semiconductor substrate. Porous columns extend from the porous layer in direction of the main surface. A non-porous portion laterally separates the porous columns from each other.

The present disclosure further relates to another semiconductor device. The semiconductor device includes a porous layer portion at a distance to a first surface of a semiconductor portion. Porous column portions extend from the porous layer portion in direction of the first surface. The porous column portions are laterally separated from each other.

Further embodiments are described in the dependent claims. Those skilled in the art will recognize additional features and advantages upon reading the following detailed description and on viewing the accompanying drawings.

BRIEF DESCRIPTION OF THE DRAWINGS

The accompanying drawings are included to provide a further understanding of the present embodiments and are incorporated in and constitute a part of this specification. The drawings illustrate the present embodiments and together with the description serve to explain principles of the embodiments. Further embodiments and intended advantages will be readily appreciated as they become better understood by reference to the following detailed description.

DETAILED DESCRIPTION

In the following detailed description, reference is made to the accompanying drawings, which form a part hereof and in which are shown by way of illustration specific embodiments in which the disclosure may be practiced. It is to be understood that other embodiments may be utilized and structural or logical changes may be made without departing from the scope of the present disclosure. For example, features illustrated or described for one embodiment can be used on or in conjunction with other embodiments to yield yet a further embodiment. It is intended that the present disclosure includes such modifications and variations. The examples are described using specific language, which should not be construed as limiting the scope of the appending claims. The drawings are not scaled and are for illustrative purposes only. Corresponding elements are designated by the same reference signs in the different drawings if not stated otherwise.

The terms "having", "containing", "including", "comprising" and the like are open, and the terms indicate the presence of stated structures, elements or features but do not preclude additional elements or features. The articles "a", "an" and "the" are intended to include the plural as well as the singular, unless the context clearly indicates otherwise.

The term "electrically connected" describes a permanent low-resistive connection between electrically connected elements, for example a direct contact between the concerned elements or a low-resistive connection via a metal and/or heavily doped semiconductor material. The term "electrically coupled" includes that one or more intervening element(s) adapted for signal transmission may be between the electrically coupled elements, for example, elements that are controllable to temporarily provide a low-resistive connection in a first state and a high-resistive electric decoupling in a second state.

The Figures illustrate relative doping concentrations by indicating "−" or "+" next to the doping type "n" or "p". For example, "n−" means a doping concentration which is lower than the doping concentration of an "n"-doping region while an "n+"-doping region has a higher doping concentration than an "n"-doping region. Doping regions of the same relative doping concentration do not necessarily have the same absolute doping concentration. For example, two different "n"-doping regions may have the same or different absolute doping concentrations.

Figure 1A:
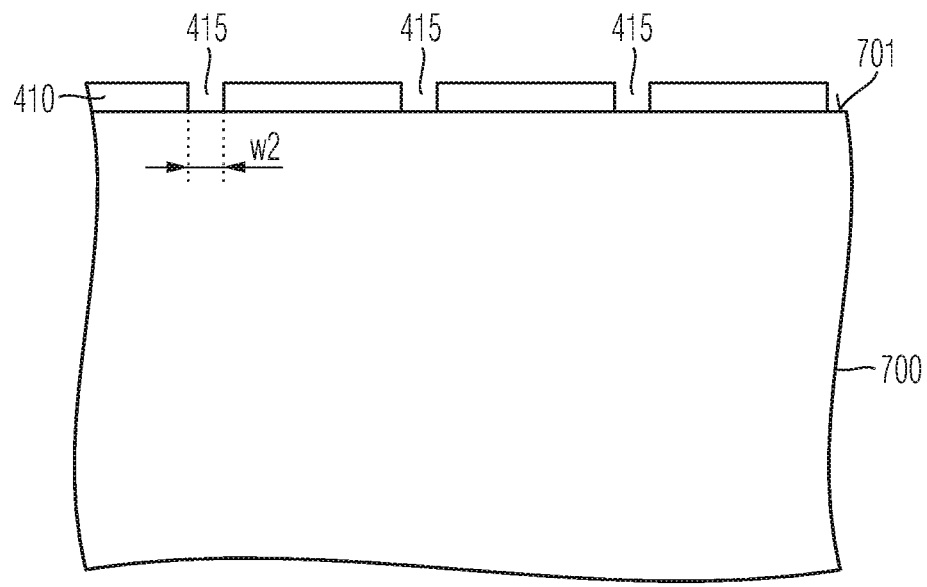
FIG. 1A is a schematic vertical cross-sectional view of a portion of a semiconductor substrate for illustrating a method of forming a porous structure according to an embodiment, after forming an auxiliary mask with isolated mask openings.
Figure 1B:
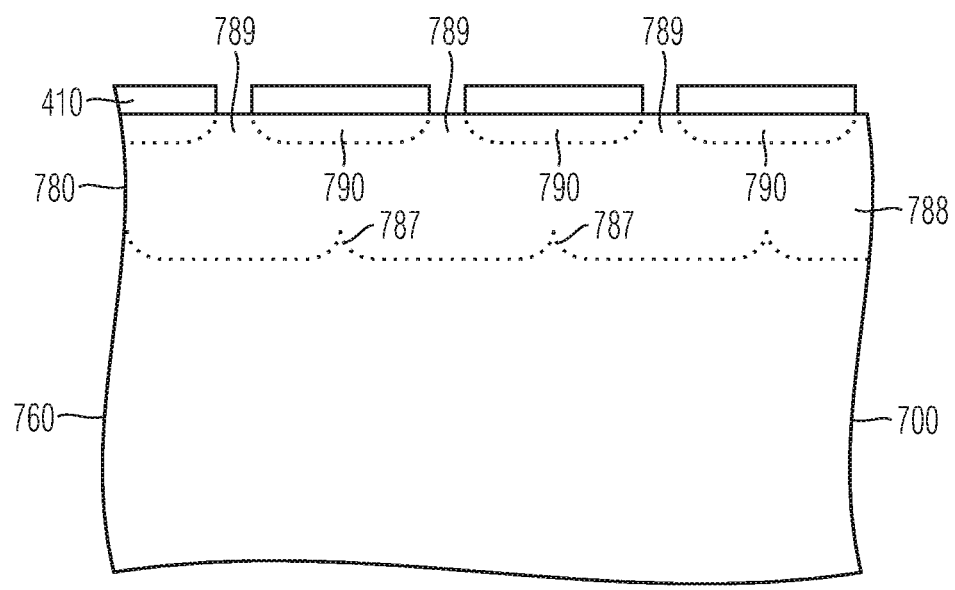
FIG. 1B is a schematic vertical cross-sectional view of the semiconductor substrate portion of FIG. 1A, after forming a porous structure including porous columns.
Figure 1C:
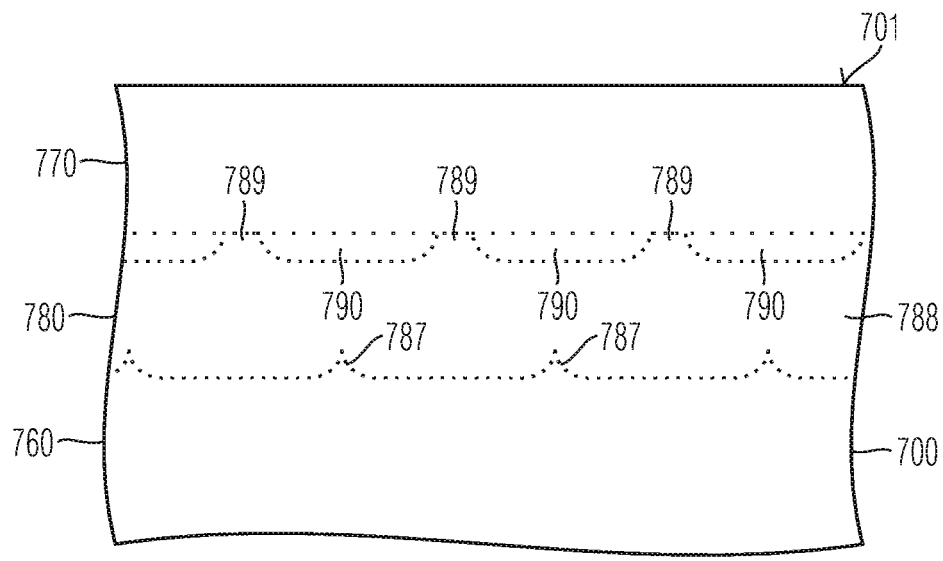
FIG. 1C is a schematic vertical cross-sectional view of the semiconductor substrate portion of FIG. 1B, after forming a non-porous device layer.

FIGS. 1A to 1C relate to the formation of a buried porous structure. A mask layer is deposited on a main surface 701 of a semiconductor substrate 700. A photolithography process transforms the mask layer into an auxiliary mask 410 with a plurality of laterally separated mask openings 415.

FIG. 1A shows a semiconductor substrate 700, e.g., a non-porous single-crystalline semiconductor crystal, which may be or may be formed from a slice obtained from a single crystalline ingot by sawing. For example, the semiconductor substrate 700 may be a flat disk such as a silicon wafer, a germanium wafer, or a wafer of a compound semiconductor, e.g., SiC, GaN or GaAs with a planar main surface 701 at a front side. A normal to the main surface 701 defines a vertical direction and directions parallel to the main surface 701 are horizontal or lateral directions.

The semiconductor substrate 700 may include one or more differently doped non-porous crystalline semiconductor layers. According to an embodiment, the semiconductor substrate 700 is homogenously p-doped with a mean dopant concentration of at least $10^{13}$ cm$^{-3}$. The auxiliary mask 410 may be or may include a silicon nitride mask, by way of example. The auxiliary mask 410 forms a regular or irregular grid that laterally separates a plurality of isolated mask openings 415 from each other.

The mask openings 415 may distribute at uniform mean density across at least a portion of the main surface 701 or across the complete main surface 701, wherein the mask openings 415 expose at most 50% of the main surface 701, e.g., at most 10% or at most 5%. According to other embodiments the auxiliary mask 410 may include first mask sections and at least one second mask section, wherein in the first mask sections the mask openings 415 distribute at a first mean density and expose at most 50% of the main surface 701, e.g., at most 10%, and the at least one second mask section does not include mask openings 415.

A maximum lateral width w2 of the mask openings 415 is at most 5 μm, e.g., at most 150 nm. A horizontal cross-sectional area of the mask openings 415 is at most 25 μm$^2$, e.g., at most 22500 nm$^2$.

A porous structure 780 is formed in the semiconductor substrate 700, for example, by anodization in an electrolyte containing fluorine, wherein the electrolyte may contain hydrofluoric acid (HF) and ethanol. Anodization electrochemically dissolves to some degree the silicon crystal in the area of the porous structure 780. Rather than dissolving the silicon crystal uniformly, electrochemical dissolution locally excavates silicon atoms from the silicon crystal lattice, wherein small holes or pores form within the silicon crystal, which crystal skeleton remains unaffected in the rest.

FIG. 1B shows the porous structure 780 that include a porous layer 788 and a plurality of porous columns 789. The porous columns 789 vertically protrude from the porous layer 788 into direction of the main surface 701 in the vertical projection of the mask openings 415 and may extend from the main surface 701 to the porous layer 788. The porosity of the porous structure 780 may be in a range from 10% to 70%.

A grid-like non-porous portion 790 between the auxiliary mask 410 and the porous layer 788 remains to a high degree unaffected by the anodization and laterally surrounds the porous columns 789.

Anodization does not affect a non-porous base portion 760 of the semiconductor substrate between the porous layer 788 and a rear side. At the side oriented to the base portion 760, the porous structure 780 may include a grid-shaped notch 787 which meshes are laterally centered between the porous columns 789.

The auxiliary mask 410 is removed and a non-porous device layer 770 is formed on the re-exposed main surface 701. Formation of the device layer 770 may include an epitaxy process, wherein the grid-like crystalline non-porous portion 790 provides sufficient information about the crystal lattice such that the device layer 770 forms with high crystal quality even in the vertical projection of the porous columns 789, which have a comparatively small horizontal cross-sectional area.

As shown in FIG. 1C formation of the device layer 770 includes crystal-growth in the vertical projection of the porous columns 789. According to an embodiment formation of the device layer 770 includes a heat treatment in a reducing atmosphere, for example, in an atmosphere containing hydrogen to form a continuous, non-porous single-crystalline starting layer for a subsequent epitaxy. Alternatively or in addition, the heat treatment may include a layer anneal selectively effective along the main surface 701.

Compared to methods that form an epitaxial layer directly on a porous layer, the grid-like non-porous portion 790 with openings with lateral dimensions significantly smaller than a lateral extension of a semiconductor device provides a suitable base for epitaxial growth at high crystal quality. Other than methods forming a porous grid separating isolated crystalline device regions, a target size of semiconductor devices formed from the semiconductor substrate 700, which includes the device layer 770, is decoupled from formation of the porous layer. Distances between neighboring porous columns 789 can be significantly smaller than an edge length of semiconductor devices obtained from the semiconductor substrate 700.

The buried porous structure 780 of FIG. 1C may be used as etch stop, wherein the porous structure 780 may be partly removed or totally removed after detection of an etch stop signal generated at exposure of the porous structure 780. According to other embodiments, the porous structure 780 may become integral part of semiconductor devices formed from the semiconductor substrate 700 of FIG. 1C. Alternatively or in addition, the porous structure 780 may be precursor for the formation of a buried oxide layer or may be effective as separation layer in a wafer cut process.

Figure 2:
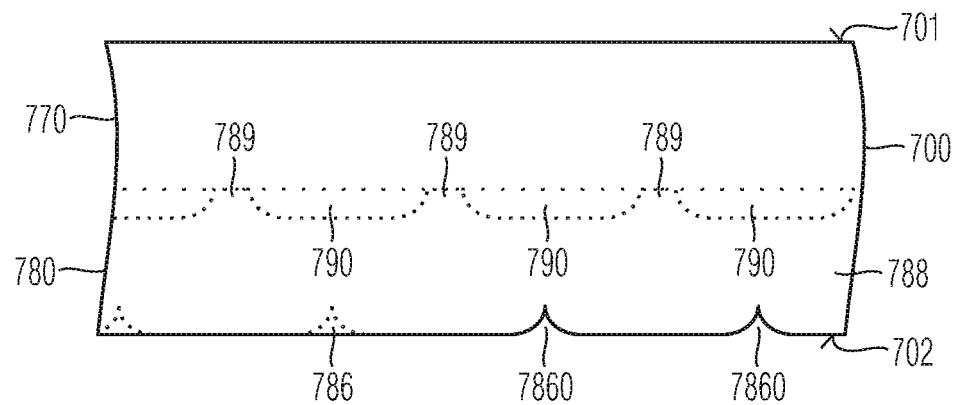
FIG. 2 is a schematic vertical cross-sectional view of a portion of a semiconductor substrate for illustrating a method of manufacturing semiconductor devices according to an embodiment related to the use of a porous layer as etch stop.

FIG. 2 refers to the use of the porous structure 780 of FIG. 1C as an auxiliary structure to control thinning of the semiconductor substrate 700 of FIG. 1C from a rear side opposite to the main surface 701.

Starting from the semiconductor substrate 700 of FIG. 1C, functional elements of semiconductor devices, for example, transistor cells are formed in the device layer 770 between the main surface 701 and the porous structure 780. Before or after forming a metallization at the front side, the semiconductor substrate 700 may be thinned from the rear side, e.g., by a chemical-mechanical polishing process, by grinding, by plasma etching or by a wet chemical process.

A process control monitors a property of the set-up for thinning and generates a stop signal once the porous structure 780 is exposed from the rear side. The stop signal may be used to stop the thinning process immediately or after a certain follow-up time. The monitored property may be an optical characteristic of the porous structure 780 or a progress speed of the thinning process, by way of example.

FIG. 2 shows a semiconductor substrate 700 with a rear side surface 702 defined by a bottom edge of the porous structure 780. A remnant portion of the non-porous base portion 760 of FIG. 1C may form a non-porous grid 786 which meshes are laterally centered between the porous columns 789 as illustrated on the left-hand side of FIG. 2. According to another embodiment, the non-porous base portion 760 of FIG. 1C may be removed completely such that a grid-like cavity 7860 may be formed in the rear side surface 702 as illustrated on the right-hand side of FIG. 2. According to a further embodiment the rear side surface 702 may be planarized, e.g., by grinding or polishing.

FIGS. 3A to 3D relate to a method using a porous structure 780 as described above as precursor for a buried oxide layer.

Figure 3A:
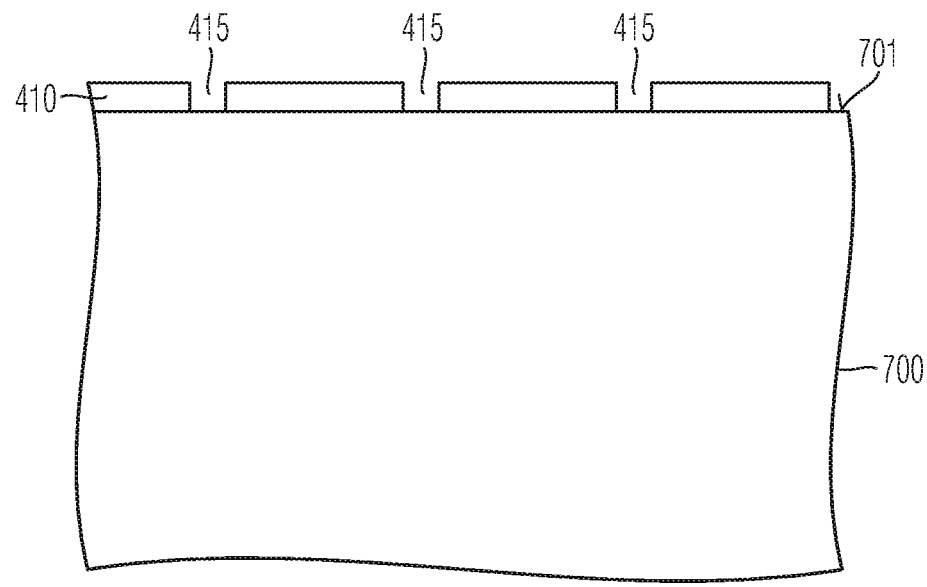
FIG. 3A is a schematic vertical cross-sectional view of a portion of a semiconductor substrate for illustrating a method of manufacturing semiconductor devices according to an embodiment related to the formation of a buried oxide layer, after forming an auxiliary mask.

FIG. 3A shows an auxiliary mask 410 formed on a main surface 701 of a semiconductor substrate 700 as described in detail with reference to FIG. 1A. A porous structure 780 is formed by anodization between the main surface 701 and a base portion 760 that remains unaffected by the anodization.

Figure 3B:
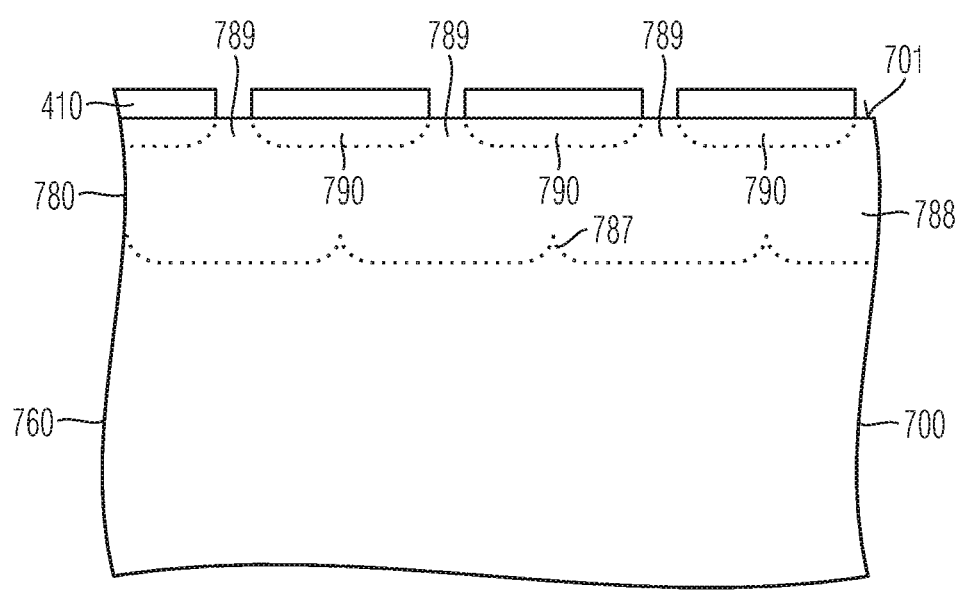
FIG. 3B is a schematic vertical cross-sectional view of the semiconductor substrate portion of FIG. 3A, after forming a porous structure including porous columns.

FIG. 3B shows the porous structure 780 including a porous layer 788 and porous columns 789 between the main surface 701 and the porous layer 788. The porosity of the porous structure 780 may be in a range from 25% to 85%, at least in a vertical section of the porous layer 788 directly adjoining the non-porous base portion 760.

An oxide layer 750 is formed from at least a vertical section of the porous structure 780 directly adjoining the non-porous base portion 760 by oxidation that may include, e.g., at least one of thermal oxidation and anodic oxidation. According to an embodiment oxidation includes anodic oxidation in an electrolyte containing an oxygen source, for example, water. The oxide layer 750 may also grow to some degree at the expense of the non-porous base portion 760.

Figure 3C:
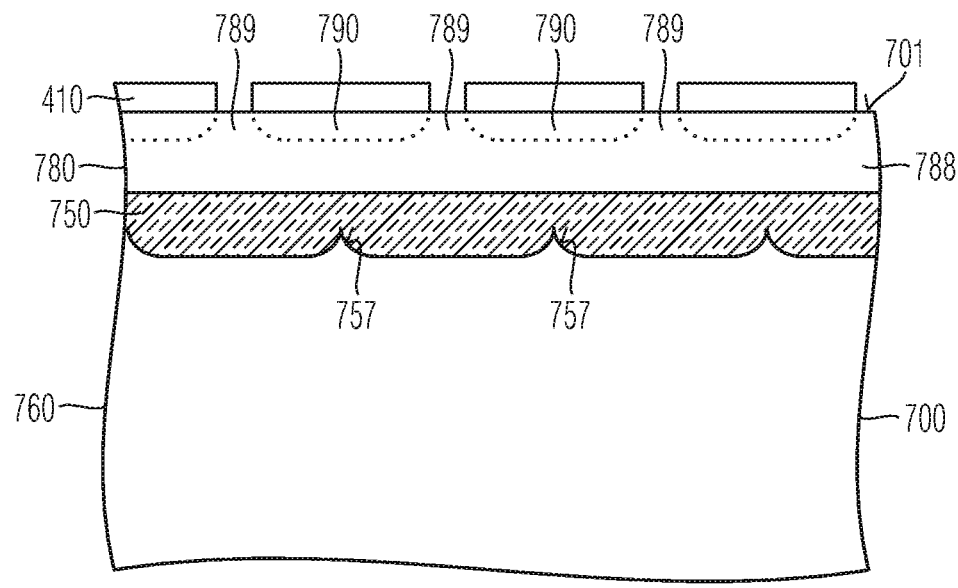
FIG. 3C is a schematic vertical cross-sectional view of the semiconductor substrate portion of FIG. 3B, after forming a buried oxide layer.

FIG. 3C shows the oxide layer 750 formed in a vertical bottom section of the porous structure 780 of FIG. 3B. The oxide layer 750 may include a dense bottom portion along the non-porous base portion 760 and a less dense portion at a distance to the non-porous base portion 760, wherein the dense bottom portion predominantly forms in the non-porous base portion 760 of FIG. 3B and the less dense portion is formed in the porous structure 780 of FIG. 3B.

A vertical extension of the remaining porous layer 788 is significantly reduced. Alternatively, the porous structure 780 of FIG. 3B may be completely transformed into an oxide layer, e.g., by an oxidation process including a heat treatment in an ambient containing oxygen. At the side oriented to the non-porous base portion 760, the oxide layer 750 may include a grid-shaped indentation 757 which meshes are laterally centered between the porous columns 789.

The auxiliary mask 410 is removed and a non-porous device layer 770 is formed by epitaxy on the main surface 701.

Figure 3D:
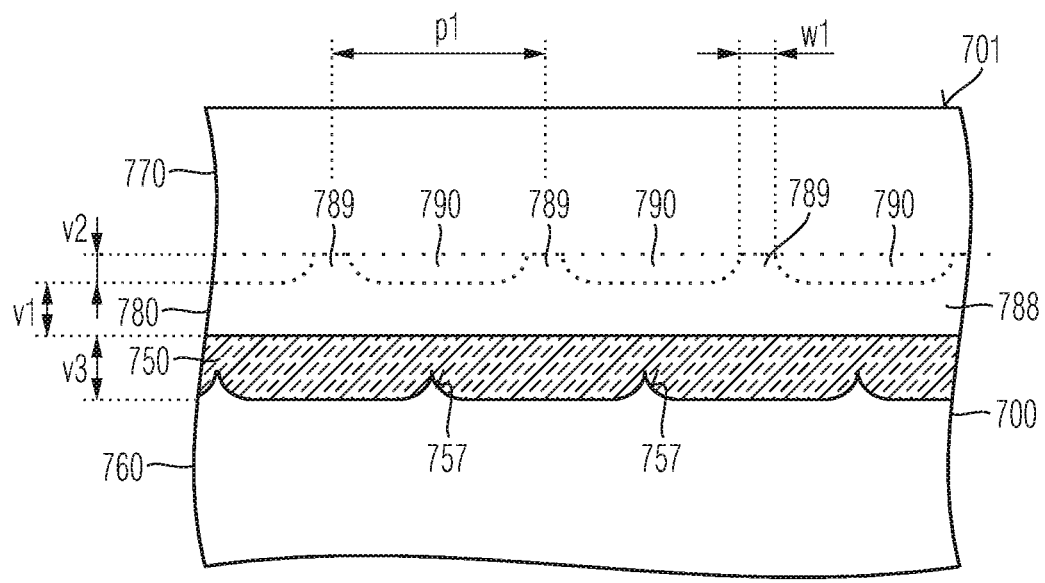
FIG. 3D is a schematic vertical cross-sectional view of the semiconductor substrate portion of FIG. 3C, after forming a non-porous device layer.

FIG. 3D shows the semiconductor substrate 700 including the non-porous device layer 770, wherein an exposed planar surface of the device layer 770 forms the new main surface 701 of the semiconductor substrate 700. Due to the formation on the grid-like non-porous portion 790 and the comparatively small lateral cross-sections of the porous columns 789, a crystal quality of the device layer 770 is comparatively high even in a vertical projection of the porous columns 789.

The buried oxide layer 750 is formed at a distance to the main surface 701. The porous structure 780 includes a porous layer 788 and porous columns 789 protruding from the porous layer 788 into direction of the front side. A vertical extension v1 of the porous layer 788 may be in a range from 0.1 µm to 5 µm, for example from 0.5 µm to 1 µm. A vertical extension v2 of the porous columns 789 may in the range of some nanometers and a vertical extension v3 of the buried oxide layer 750 may in a range from 0.1 µm to 4 µm, for example from 0.1 µm to 0.2 µm. A mean center-to-center distance p1 between neighboring porous columns 789 may be in a range from 200 nm to 5 µm. A maximum horizontal width w1 of the porous columns 789 may be in a range from 100 nm to 2 µm.

The buried oxide layer 750 may be used as a layer controlling a thinning of the semiconductor substrate 700 from the rear side, wherein the buried oxide layer 750 may be partly or completely removed or may be part of a layered separation structure for a wafer cut process. Alternatively, the buried oxide layer 750 may be used in SOI (silicon-on-insulator) devices, wherein the buried oxide layer 750 electrically decouples electronic elements formed in the device layer 770 from the non-porous base portion 760 between the buried oxide layer 750 and the rear side.

Figure 4A:
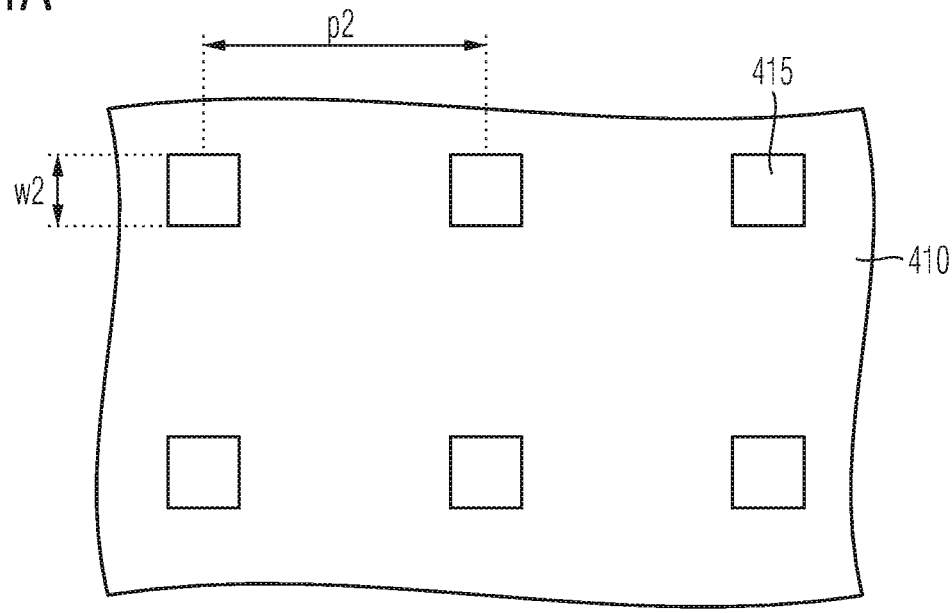
FIG. 4A is a schematic plan view of an auxiliary mask according to an embodiment related to square mask openings.
Figure 4B:
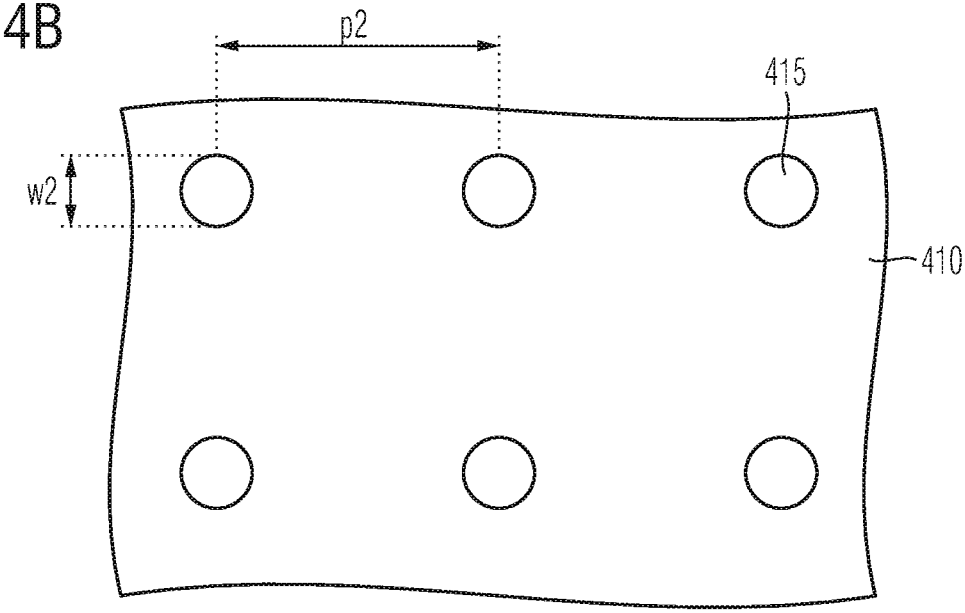
FIG. 4B is a schematic plan view of an auxiliary mask according to an embodiment related to circular mask openings.

FIGS. 4A and 4B refer to details of the auxiliary mask 410. The auxiliary mask 410 may be a single layer or may be a layer stack including sub-layers from two or more different materials. For example, the auxiliary mask 410 includes a silicon nitride layer.

The mask openings 415 may be arranged irregularly or may form a regular pattern. For example, the mask openings 415 may be arranged along rows, for example in rows and columns or in rows with neighboring rows shifted to each other along a row longitudinal axis by, e.g., half a center-to-center distance between neighboring mask openings 415 within the row. The mask openings 415 may be formed across portions or across a complete main surface 701 of a semiconductor substrate 700 at a same mean density, wherein the mask openings 415 expose at most 50% of the main surface 701, e.g., at most 10%.

According to other embodiments the auxiliary mask 410 may include first mask sections and at least one second mask section, wherein in the first mask sections the mask openings 415 distribute at a first mean density and expose at most 50% of the main surface 701, e.g., at most 10%, and the at least one second mask section does not include mask openings 415 or includes mask openings 415 at a second mean density significantly lower than the first mean density.

FIGS. 4A and 4B show a portion of a semiconductor substrate 700 where the mask openings 415 form a regular pattern of rows and columns. A center-to-center distance p2 between neighboring mask openings 415 may be in a range from 0.2 µm to 10 µm, for example, from 0.8 µm to 1 µm. A maximum lateral width w2 of the mask openings 415 may be in a range from 50 nm to 5 µm, for example from 200 nm to 300 nm. The minimum lateral width w2 may be at least twice the mean diameter of pores in a porous structure formed at a later stage, wherein the mean diameter of the pores may be in a range from 1 nm to 1 µm.

The mask openings 415 may have the same lateral extension along two orthogonal horizontal directions as illustrated. According to other embodiments, a width of the mask openings 415 along a first horizontal direction may be greater than along a second horizontal direction orthogonal to the first horizontal direction. A horizontal cross-section of the mask openings 415 may be a polygon with or without rounded corners, for example, a cross, a rectangle or a square as illustrated in FIG. 4A.

According to other embodiments, the horizontal cross-section of the mask openings 415 may be an oval or an ellipse, for example a circle as illustrated in FIG. 4B.

Figure 5A:
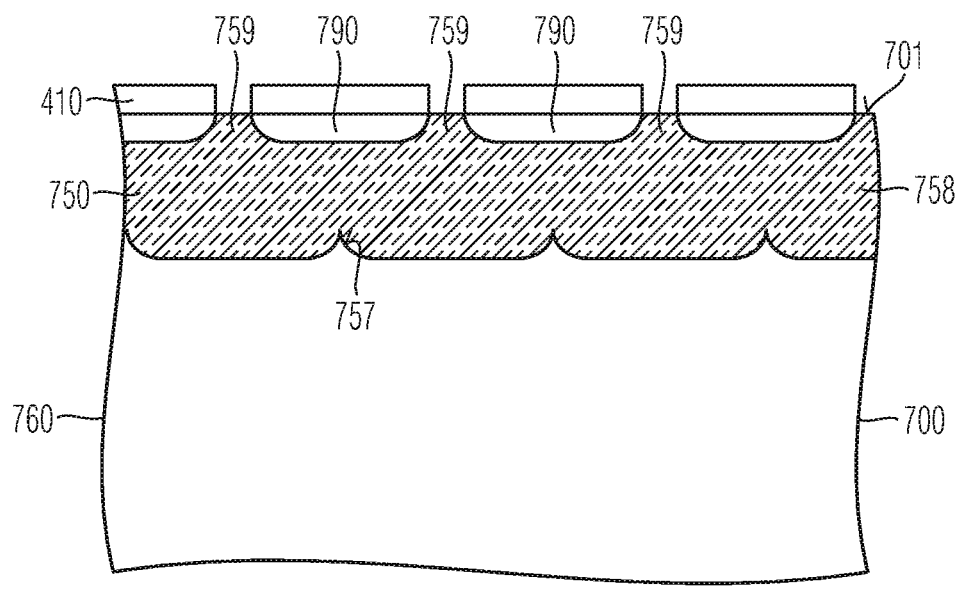
FIG. 5A is a schematic vertical cross-sectional view of a portion of a semiconductor substrate for illustrating a method of manufacturing semiconductor devices according to an embodiment related to a complete oxidation of a porous layer, after oxidation.
Figure 5B:
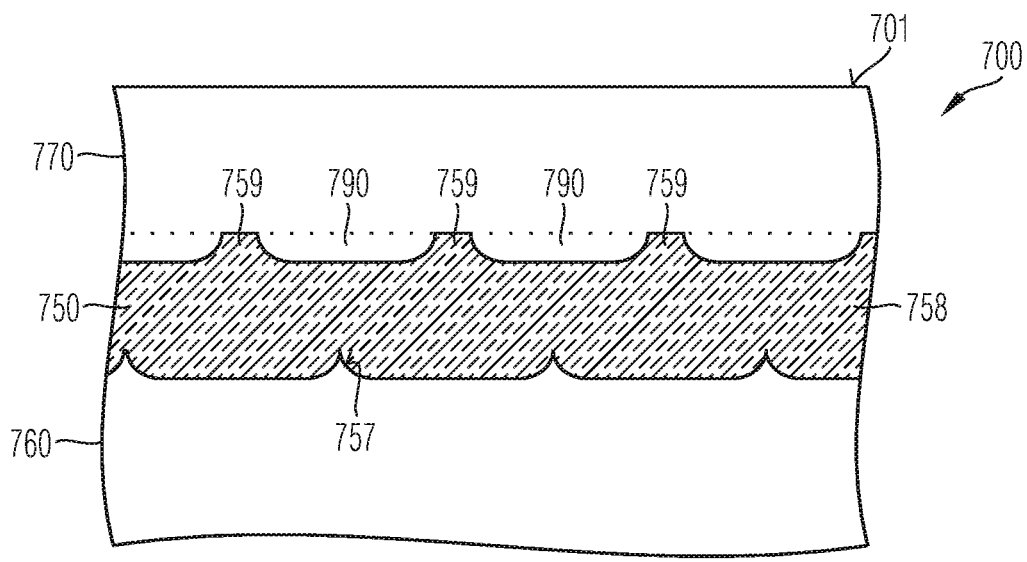
FIG. 5B is a schematic vertical cross-sectional view of the semiconductor substrate portion of FIG. 5A, after forming a non-porous device layer.

FIGS. 5A to 5B relate to the formation of a buried oxide layer by thermal oxidation of a porous structure as described above.

A porous structure is formed in a semiconductor substrate 700 as described with reference to FIGS. 1A to 1B. The mean diameter of pores in the porous structure may be in a range from 1 nm to 1 µm. A heat treatment in an atmosphere containing oxygen or a suitable oxygen compound may transform the porous structure 780 of FIG. 1B completely into an oxide layer 750.

FIG. 5A shows the oxide layer 750 including a layer section 758 and column sections 759 protruding from the layer section 758 and directly adjoining the main surface 701, wherein the column sections 759 are laterally separated from each other by a non-porous portion 790 of the semiconductor substrate 700. The auxiliary mask 410 is removed and silicon is deposited by epitaxy on the main surface 701.

FIG. 5B shows the epitaxial grown device layer 770 formed directly on the non-porous portion 790 and above the column sections 759. The silicon atoms of the device layer 770 grow in registry with the un-disturbed and complete silicon crystal of the non-porous portion 790 and laterally overgrow the comparatively small column sections 759 of the buried oxide layer 750 from all sides.

FIGS. 6A to 6D relate to an embodiment for increasing a vertical extension of the non-porous portion 790 of FIG. 1B, 3B or 5A.

An auxiliary layer 742 is formed on a base substrate 741 of the semiconductor substrate 700, wherein the auxiliary layer 742 and the base substrate 741 form a horizontal junction j1. The base substrate 741 may be p-type or n-type. The illustrated embodiment shows an p-type base substrate 741 and an n-doped auxiliary layer 742, wherein the junction j1 forms a pn junction.

According to another embodiment, the auxiliary layer 742 may be intrinsic or may have the same conductivity type as the base substrate 741 at a significant lower mean dopant concentration than the base substrate 741. For example, the mean net dopant concentration in the base substrate 741 is at least two orders of magnitude higher than in the auxiliary layer 742.

A vertical extension v4 of the auxiliary layer 742 may be in the range from 10 nm to 10 µm, for example in a range from 10 nm to 100 nm. The auxiliary layer 742 may be formed by epitaxy including in-situ doping or by implantation, by way of example. An auxiliary mask 410 is formed on a main surface 701 of a semiconductor substrate 700 that includes the base substrate 741 and the auxiliary layer 742, wherein the main surface 701 is formed by an exposed surface of the auxiliary layer 742.

Figure 6A:
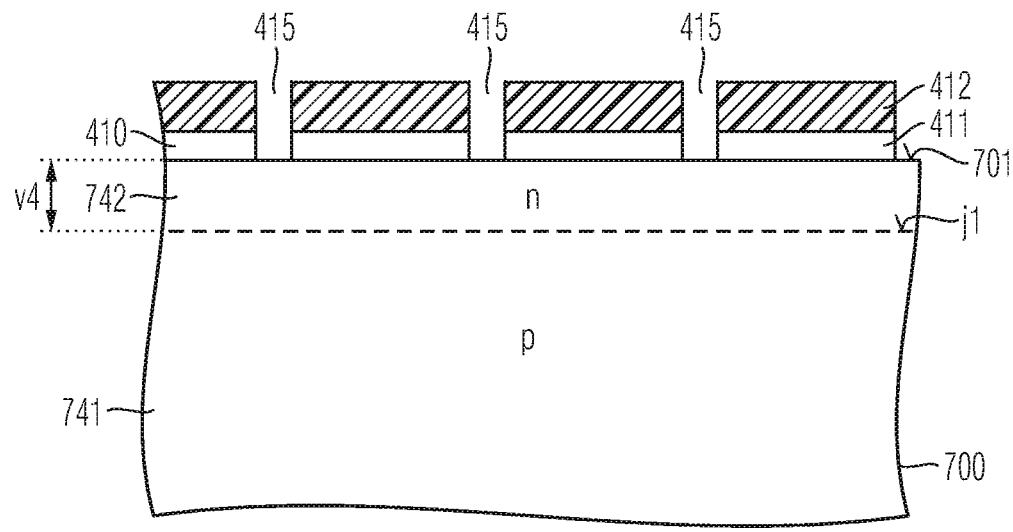
FIG. 6A is a schematic vertical cross-sectional view of a portion of a semiconductor substrate for illustrating a method of manufacturing semiconductor devices according to an embodiment related to a thick non-porous portion, after forming an auxiliary mask on an auxiliary layer.

FIG. 6A shows the auxiliary mask 410 including mask openings 415 exposing first portions of the auxiliary layer 742 and covering second portions of the auxiliary layer 742. The auxiliary mask 410 may include a first portion 411, e.g., a silicon nitride portion or a silicon oxide portion directly adjoining the main surface 701 and a second portion 412, e.g., a photoresist portion on the first portion 411.

P-type dopants are implanted through the mask openings 415 to form doped columns 745 of the p-type, wherein the auxiliary mask 410 is effective as implant mask.

Figure 6B:
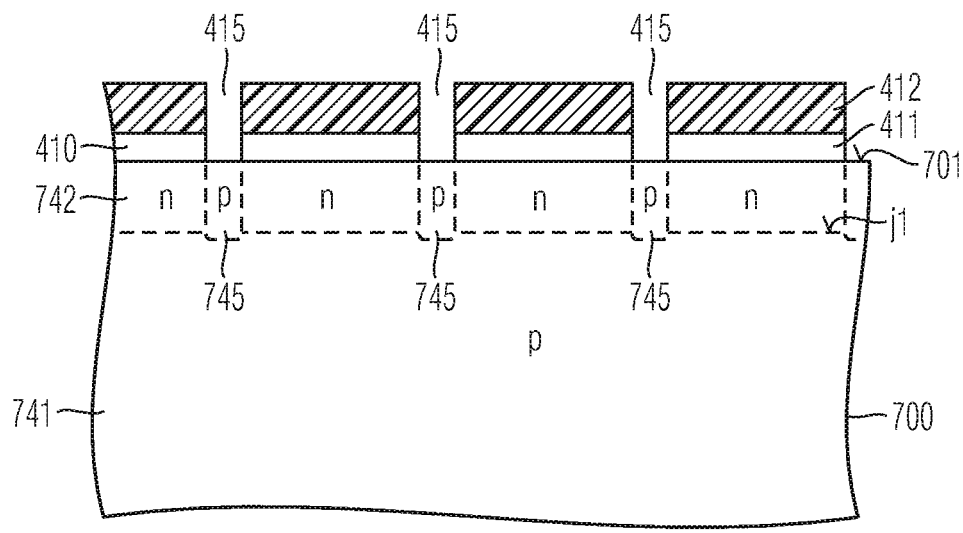
FIG. 6B is a schematic vertical cross-sectional view of the semiconductor substrate portion of FIG. 6A, after forming doped columns extending through the auxiliary layer.

FIG. 6B shows the doped columns 745 extending in the vertical projection of the mask openings 415 from the main surface 701 into the base substrate 741, wherein the p-type doped columns 745 perforate the auxiliary layer 742.

The second portion 412 of the auxiliary mask 410 may be removed and a porous structure 780 is formed by anodization. The anodization increases porosity selectively in the p-type regions including the p-type doped columns 745 and leaves the auxiliary layer 742 mainly unaffected.

Figure 6C:
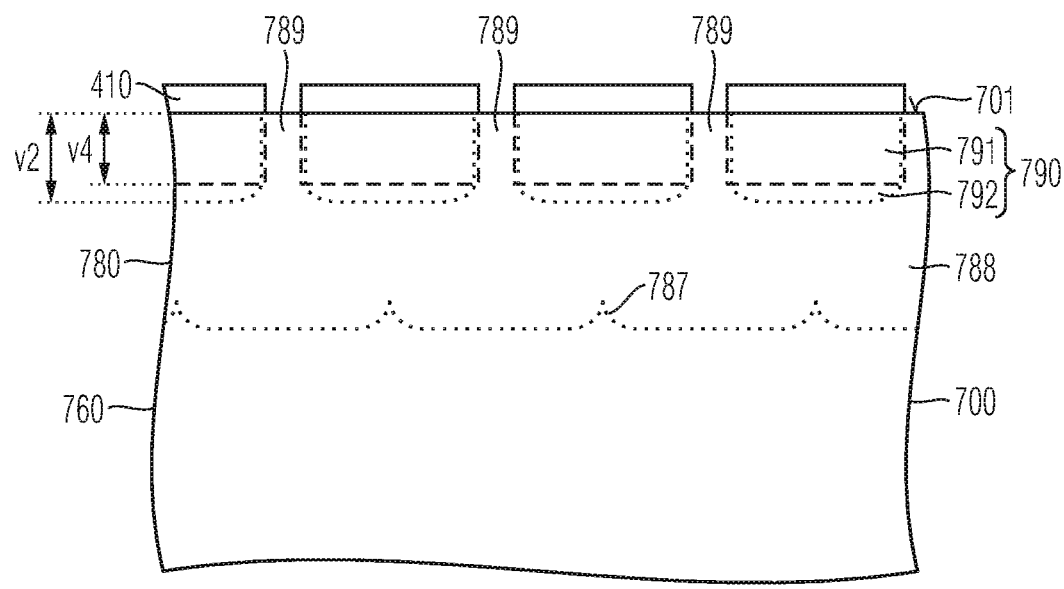
FIG. 6C is a schematic vertical cross-sectional view of the semiconductor substrate portion of FIG. 6B, after forming a porous layer.

FIG. 6C shows the porous structure 780 formed by anodization in the semiconductor substrate 700 of FIG. 6B. The porous structure 780 includes a porous layer 788 at a distance to the main surface 701 and porous columns 789 extending between the main surface 701 and the porous layer 788. A vertical extension v2 of the porous columns 789 is at least equal to the vertical extension v4 of the auxiliary layer 742.

The non-porous portion 790 between the main surface 701 and the porous layer 788 includes at least a first portion 791 directly adjoining the main surface 701 and formed from a remnant portion of the auxiliary layer 742. In addition, the non-porous portion 790 may include a second portion 792 formed from an unaffected top section of the base substrate 741.

An oxide layer 750 may be formed by anodic oxidation. The first portion 411 of the auxiliary mask 410 may be removed and a non-porous device layer 770 may be formed on the main surface 701 of FIG. 6C.

Figure 6D:
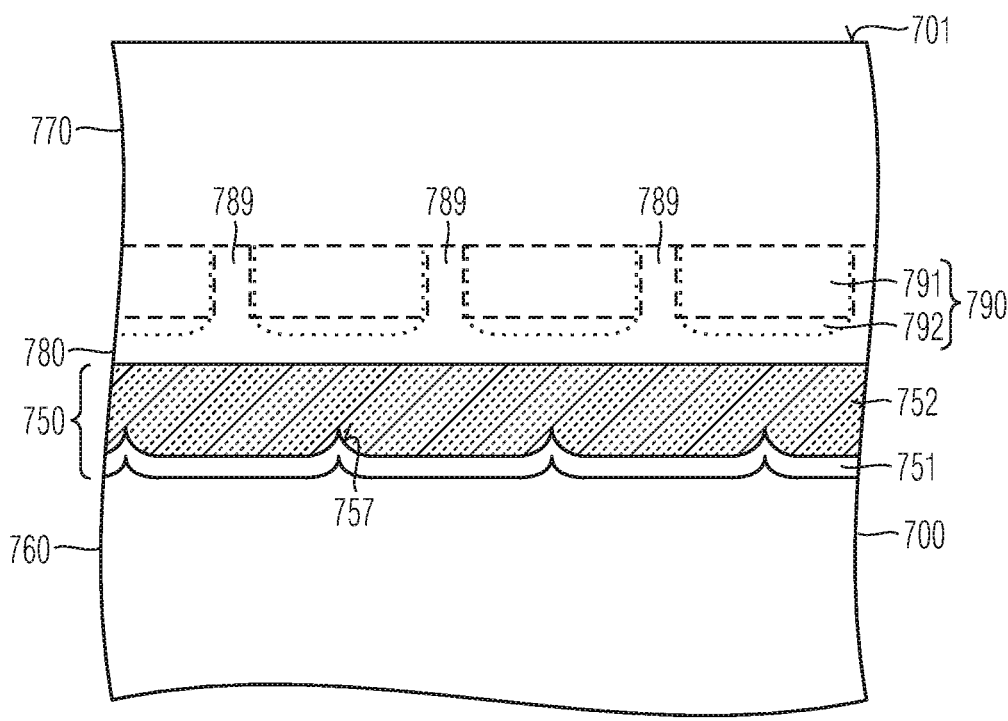
FIG. 6D is a schematic vertical cross-sectional view of the semiconductor substrate portion of FIG. 6C, after anodic oxidation and forming a non-porous device layer.

FIG. 6D shows the semiconductor substrate 700 with the new main surface 701 formed by an exposed surface of the device layer 770. In the buried oxide layer 750, a porosity or density may decrease with decreasing distance to the main surface 701. Alternatively, a comparatively dense bottom portion 751 of the buried oxide layer 750 is formed partly at the expense of the non-porous base portion 760 of FIG. 6C and a comparatively porous or less dense portion 752 may be formed between the remaining porous structure 780 and the comparatively dense bottom portion 751 of the buried oxide layer 750. Meshes of a grid-shaped indentation 757 at the bottom side of the oxide layer 750 are centered between the porous columns 789.

Figure 7A:
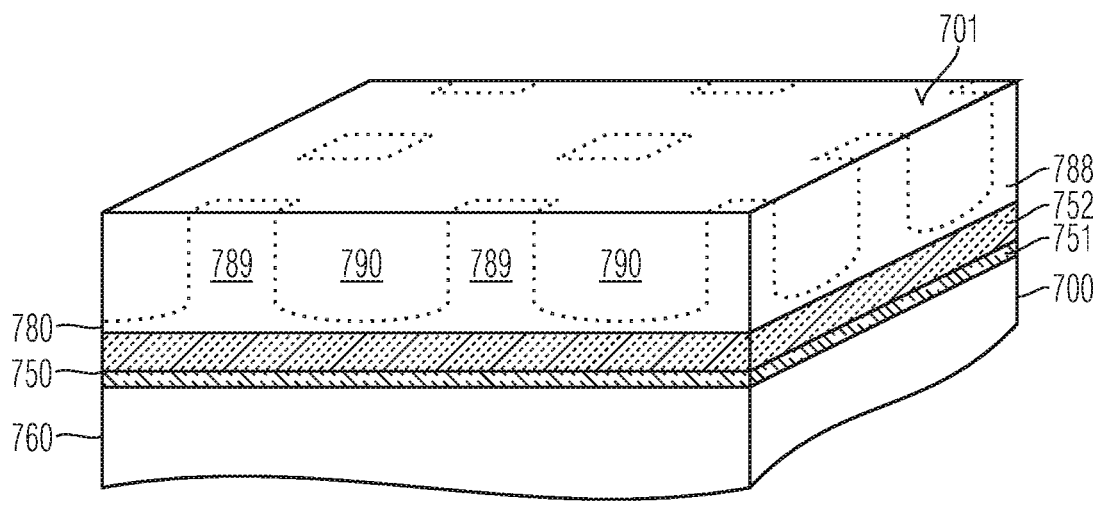
FIG. 7A is a schematic perspective view of a portion of a semiconductor substrate for illustrating a method of manufacturing semiconductor devices related to formation of a continuous non-porous starting layer of a device layer in reducing atmosphere, after forming a porous structure and a buried oxide layer.
Figure 7B:
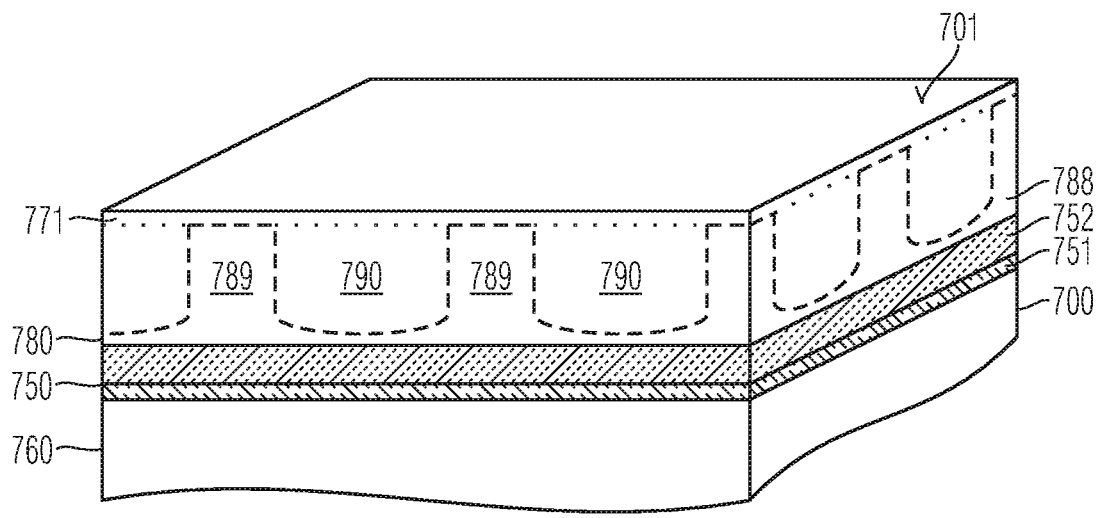
FIG. 7B is a schematic perspective view of the semiconductor substrate portion of FIG. 7A, after forming the thin non-porous starting layer.
Figure 7C:
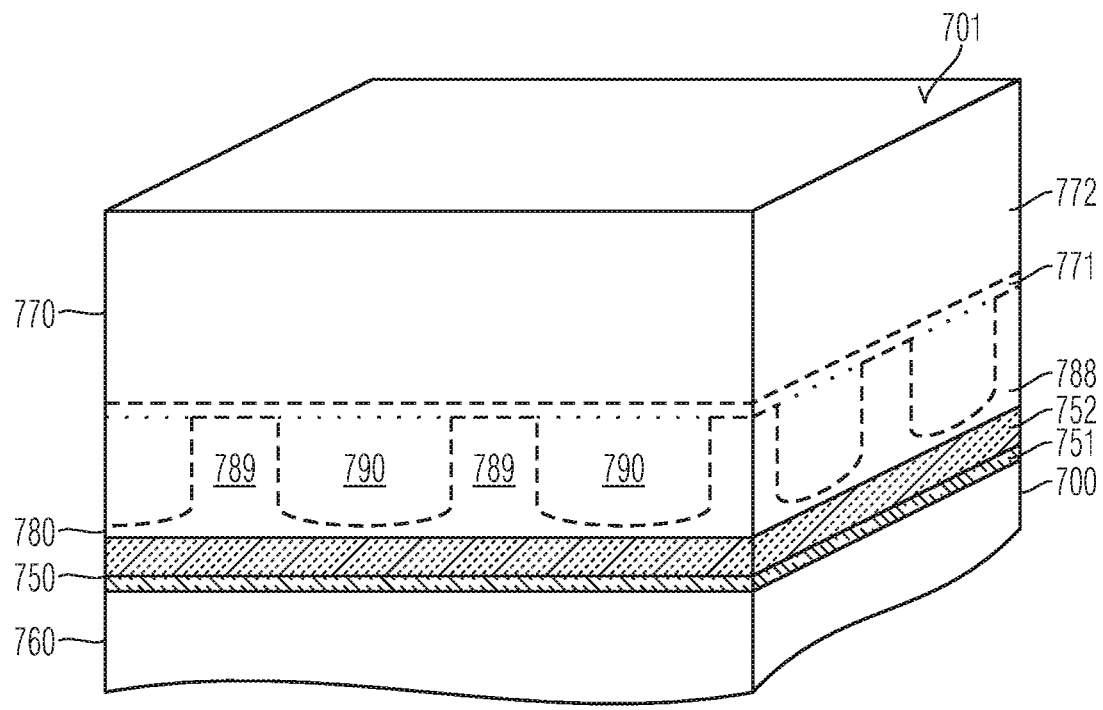
FIG. 7C is a schematic perspective view of the semiconductor substrate portion of FIG. 7B, after forming a crystalline main layer of the device layer on the non-porous starting layer.

FIGS. 7A to 7C refer to details of the formation of a device layer 770 as illustrated in FIGS. 1C, 3D and 6D.

FIG. 7A shows a semiconductor substrate 700 with a buried oxide layer 750 between a porous structure 780 and a non-porous base portion 760, wherein the porous structure 780 includes a porous layer 788 and porous columns 789 as described with reference to FIGS. 1B, 3C and 6C.

A non-porous crystalline starting layer 771 is formed. For example, the semiconductor substrate 700 is subjected to a heat treatment, e.g., in a reductive atmosphere that may contain hydrogen. The heat treatment results in a rearrangement of the silicon atoms in a thin layer along the exposed main surface 701 of the semiconductor substrate 700, wherein in a reflow process the atoms in the porous portion 789 rearrange and form a continuous thin starting layer 771 of high crystal quality. Alternative or in addition, the layer 771 may be formed by epitaxy or by rearrangement of the atoms at the surface 701 by laser anneal.

As illustrated in FIG. 7B the starting layer 771 forms also along a top of the porous columns 789 wherein the porous single crystal skeleton of the porous columns 789 is locally re-completed such that the starting layer 771 covers remnant porous sections of the porous columns 789. A main layer 772 is formed by epitaxy on the starting layer 771.

FIG. 7C shows the main layer 772 formed on the starting layer 771. Since the starting layer 771 shows high crystal quality the main layer 772 grows with high crystal quality and does not show more crystal defects than epitaxial layers grown directly on a non-porous single-crystal silicon crystal. Starting layer 771 and main layer 772 form the device layer 770 in which functional elements of semiconductor devices, e.g., transistor cells are formed at a later stage.

The porous structure 780 and the buried oxide layer 750 may form closed layers without openings and extending across the complete horizontal cross-section of the semiconductor substrate 700, wherein the closed layers may spare only an edge area along the rim of the semiconductor substrate 700. Alternatively, the porous structure 780 and the buried oxide layer 750 may spare openings within device regions and/or within a kerf region.

FIGS. 8A to 8D refer to the formation of a porous structure 780 and/or a buried oxide layer that include one or more openings connecting the device layer 770 with the non-porous base portion 760.

To this purpose an auxiliary mask 410 formed on a main surface 701 of a semiconductor substrate 700 includes unevenly distributed mask openings 415. For example, first mask sections 401 include mask openings 415 at a high density and at least one second mask section 402 includes no mask openings or mask openings 415 at low density. The second mask sections 402 may be formed within a grid-shaped kerf region 690 of the main surface 701, wherein the kerf region 690 laterally separates device regions 610. The kerf region 690 may coincide with the second mask section 402.

Figure 8A:
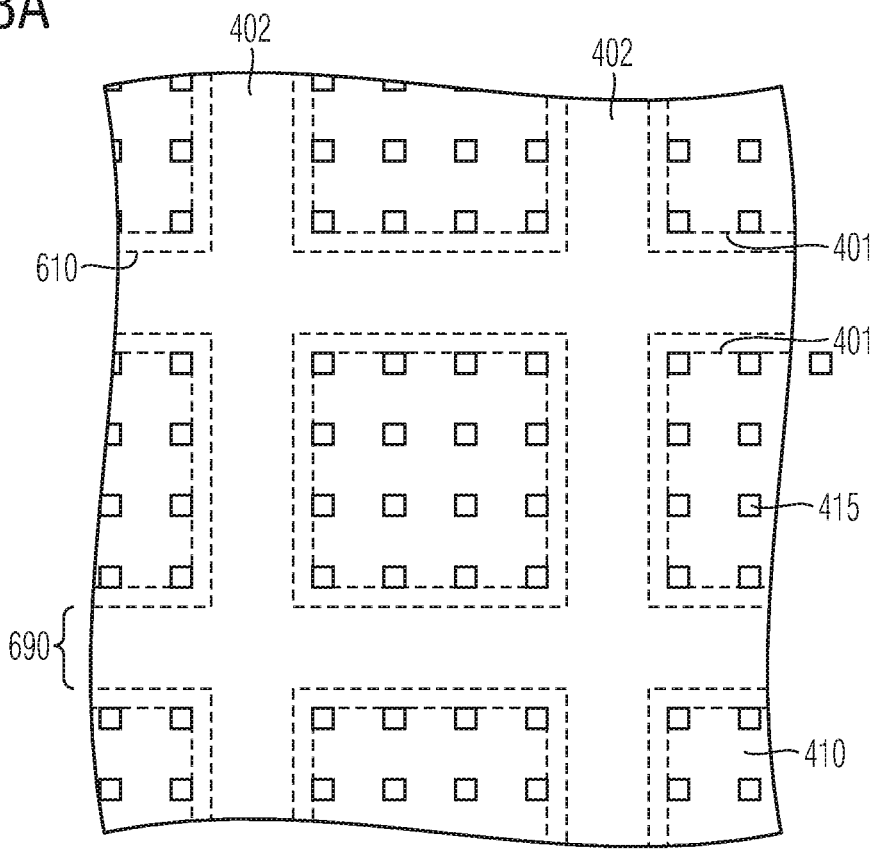
FIG. 8A is a schematic plan view of a portion of a semiconductor substrate for illustrating a method of manufacturing semiconductor devices according to an embodiment related to a buried oxide layer with openings, after forming an auxiliary mask.

FIG. 8A shows first mask sections 401 including mask openings 415 and a grid-like second mask section 402 without mask openings 415, wherein the second mask section 402 is formed within a kerf region 690 of the main surface 701.

A porous structure 780 is formed below the first mask section 401.

Figure 8B:
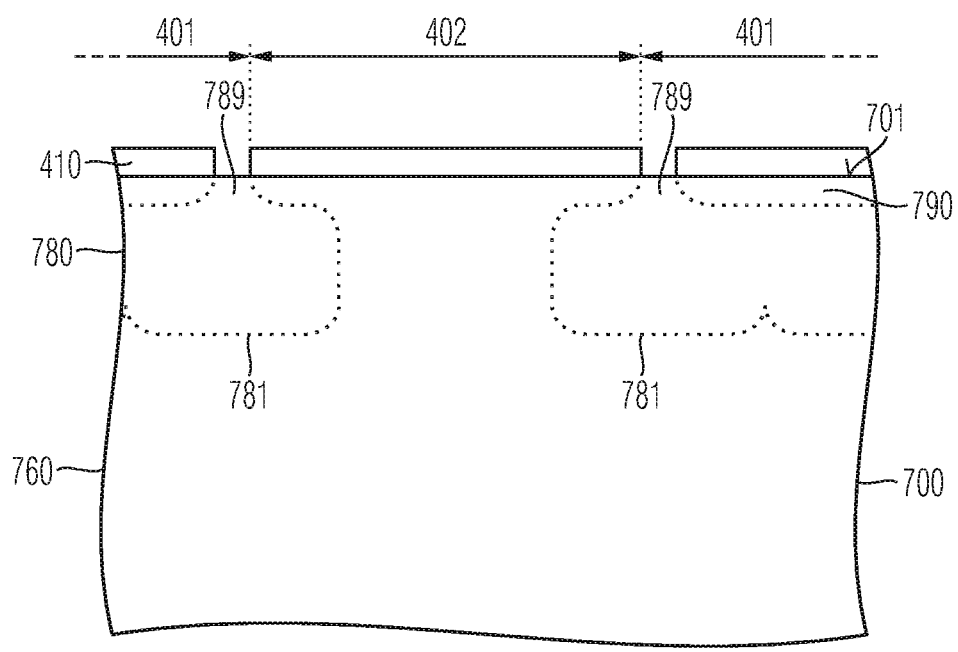
FIG. 8B is a schematic vertical cross-sectional view of a portion of the semiconductor substrate of FIG. 8A, after forming a porous structure with openings.

As illustrated in FIG. 8B, the porous structure 780 includes a plurality of laterally separated island portions 781 that are mainly formed below the first mask sections 401 and that are absent in a portion below the second mask section 402, wherein the island portions 781 may laterally extend to some degree to below the second mask section 402. At least a part of the porous structure 780 may be transformed into a buried oxide layer 750, e.g., by thermal oxidation and/or by anodic oxidation.

Figure 8C:
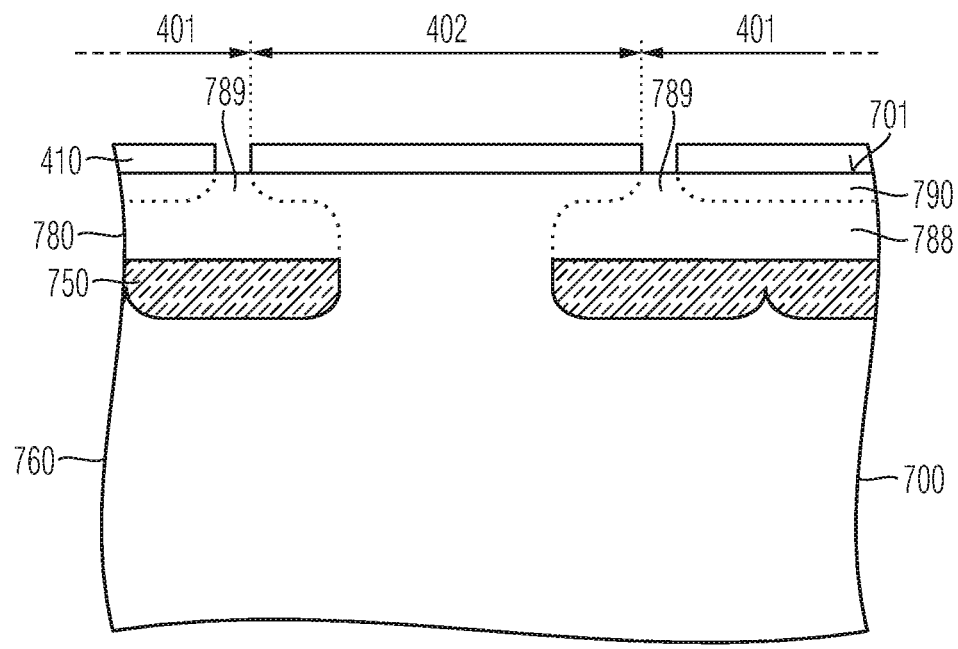
FIG. 8C is a schematic vertical cross-sectional view of the semiconductor substrate portion of FIG. 8B, after forming a buried oxide layer with openings.

FIG. 8C shows that the buried oxide layer 750 is selectively formed below the first mask sections 401 and is absent in at least a part of the semiconductor substrate 700 in the vertical projection of the second mask section 402. The buried oxide layer 750 may form at least partly at the expense of the non-porous base portion 760 of FIG. 8B and may include a dense bottom portion directly adjoining the remaining part of the porous base portion 760 and a less dense portion formed in a portion of the porous structure 780 of FIG. 8B. The auxiliary mask 410 is removed and a device layer 770 with high crystal quality is formed on the basis of the non-porous portion 790. Functional elements of semiconductor devices may be formed in device regions 610 of the device layer 770.

Figure 8D:
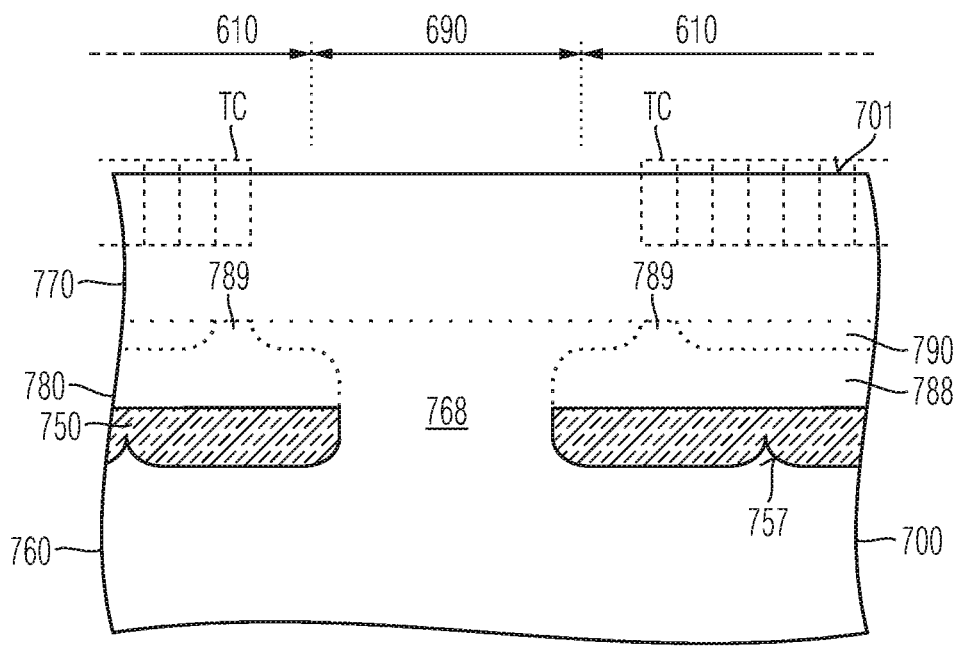
FIG. 8D is a schematic vertical cross-sectional view of the semiconductor substrate portion of FIG. 8C, after forming functional elements in a device layer.

FIG. 8D shows transistor cells TC as an embodiment of functional elements formed in the device regions 610 of the device layer 770 in the vertical projection of the buried oxide layer 750. Instead of or in addition to the transistor cells TC the device regions 610 of the device layer 770 may include anode regions of power semiconductor diodes or doped regions of other functional semiconductor elements, e.g., logic circuits. The buried oxide layer 750 and the porous structure 780 include openings such that non-porous single-crystalline columns 768 connect the device layer 770 with the non-porous base portion 760, e.g., in the kerf region 690.

Figure 9A:
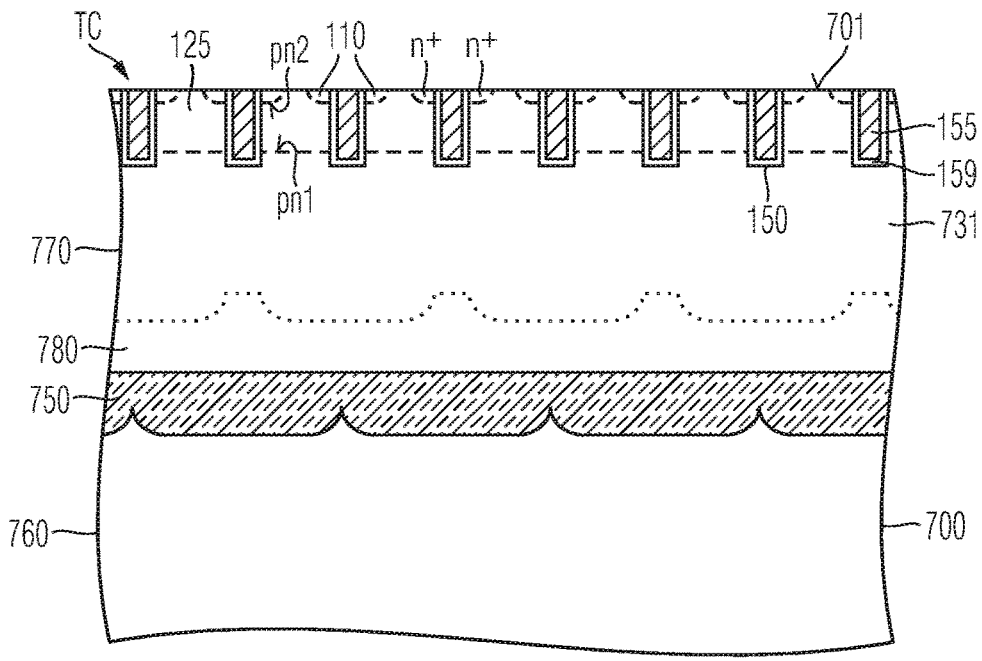
FIG. 9A is a schematic vertical cross-sectional view of a portion of a semiconductor substrate for illustrating a method of manufacturing semiconductor devices according to an embodiment related to a buried oxide layer used as etch stop, after forming functional elements in a device layer.
Figure 9B:
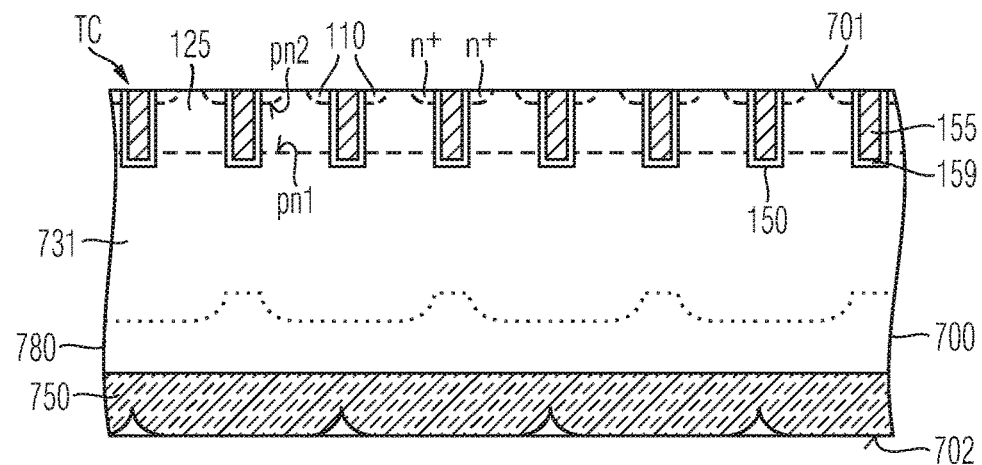
FIG. 9B is a schematic vertical cross-sectional view of the semiconductor substrate portion of FIG. 9A, after thinning from a rear side.
Figure 9C:
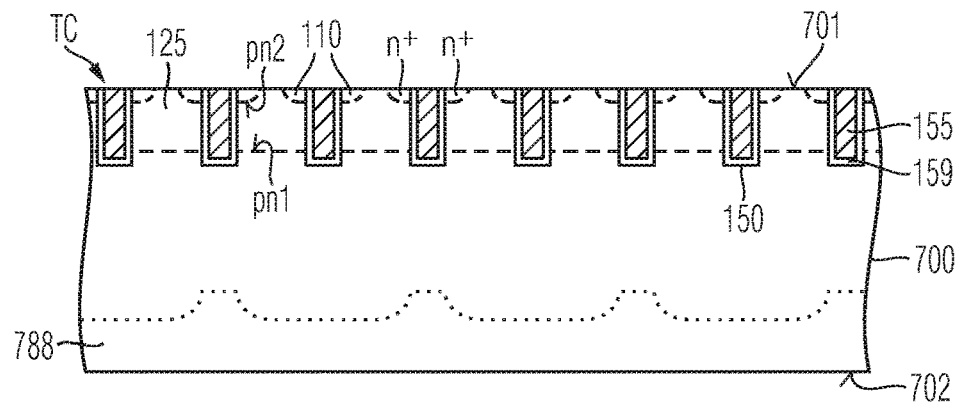
FIG. 9C is a schematic vertical cross-sectional view of the semiconductor substrate portion of FIG. 9B, after removing the buried oxide layer.

FIGS. 9A to 9C relate to an embodiment using a buried oxide layer 750 formed in one of the ways described above in a self-adjusted thinning process.

Transistor cells TC are formed in a device layer 770 of a semiconductor substrate 700 as described with reference to FIG. 3D, FIG. 5B or 6D.

As illustrated in FIG. 9A a transistor cell TC may include a gate structure 150, for example a trench gate structure 150 extending from a main surface 701 of the semiconductor substrate 700 into the device layer 770, wherein the gate structure 150 includes a conductive gate electrode 155 and a gate dielectric 159 between the gate electrode 155 and the device layer 770. In the device layer 770 a drift layer 731 may be formed between the transistor cells TC and the oxide layer 750. Source zones 110 of the conductivity type of the drift layer 731 may be formed along the main surface 701. Body regions 125 forming first pn junctions pn1 with the drift layer 731 and second pn junctions pn2 with the source zone 110 may separate the source zones 110 from the drift zone 131. According to other embodiments, the transistor cells TC include planar gate structures 150 formed above the main surface 701. In addition to the transistor cells TC, field electrodes may be formed that may extend from the main surface 701 into the device layer 770. The drift layer 731 may include a compensation structure, for example, a super-junction structure.

The semiconductor substrate 700 may be thinned from a rear side opposite to the main surface 701, wherein a base portion 760 between the buried oxide layer 750 and the rear side is completely removed.

FIG. 9B shows the thinned semiconductor substrate 700 after a thinning process that stops at or after exposure of the oxide layer 750, which defines a rear side surface 702 of the thinned semiconductor substrate 700.

The oxide layer 750 may be removed. Removal of the oxide layer 750 may include an etching process that selectively removes silicon oxide with respect to the porous structure 780 and/or a further CMP stopping at or after exposure of the porous structure 780.

FIG. 9C shows the semiconductor substrate 700 with the porous structure 780 exposed at the rear side.

Through the rear side surface 702 exposing the porous structure 780 impurities, e.g., dopants or hydrogen may be implanted into the porous structure 780 and/or into the device layer 770 to define, e.g. a buffer layer or a field stop layer with a net dopant concentration at least twice, for example, at least ten times as high as in the drift layer 731 and/or to form a heavily doped contact portion along the rear side surface 702, wherein a dopant concentration in the contact portion is sufficiently high to facilitate a low-resistive contact between the contact portion and a metal layer formed on the rear side surface 702.

FIGS. 10A to 12B refer to semiconductor substrates including at least one of a porous structure with column sections and a buried oxide layer with column sections.

Figure 10A:
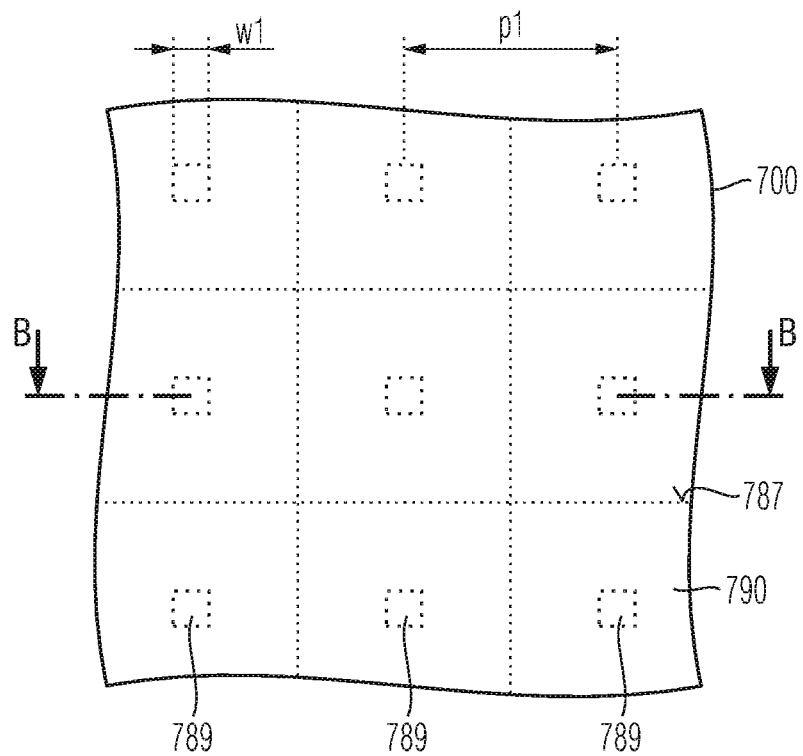
FIG. 10A is a schematic horizontal cross-sectional view of a portion of a semiconductor substrate according to an embodiment related to a buried porous structure with porous columns.
Figure 10B:
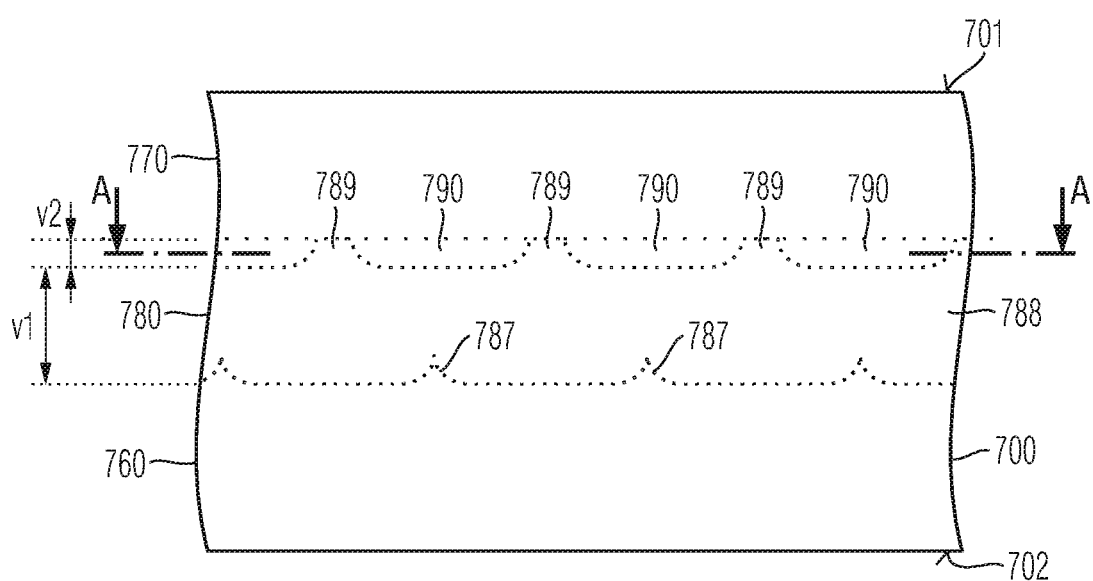
FIG. 10B is a schematic vertical cross-sectional view of the semiconductor substrate portion of FIG. 10A along line B-B.

FIGS. 10A to 10B illustrate a semiconductor substrate 700 with a buried porous structure 780 including a porous layer 788 and porous columns 789 protruding from the porous layer 788 into direction of the main surface 701. The porous structure 780 is spaced from both a main surface 701 at the front side and from a rear side surface 702 opposite to the front side. A non-porous base portion 760, which may be p-doped, is between the porous structure 780 and the rear side surface 702. The porous structure may reduce mechanical stress in the semiconductor substrate 700 and may be used to reduce wafer bowing.

A vertical extension v1 of the porous layer 788 may be in a range from 0.1 µm to 5 µm, for example from 0.5 µm to 1 µm. A vertical extension v2 of the porous columns 789 may in the range of some nanometers. A mean center-to-center distance p1 between neighboring porous columns 789 may be in a range from 200 nm to 5 µm. A maximum horizontal width w1 of the porous columns 789 may be in a range from 100 nm to 2 µm.

A grid-shaped non-porous portion 790 laterally embeds the porous columns 789. The non-porous portion 790 may form a unipolar junction, for example, a p/p⁻ or an n/n⁻ junction, or a pn junction with a non-porous, crystalline device layer 770, which may include functional elements of semiconductor devices. At a side oriented to the rear side surface 702, the buried oxide layer 750 may include a grid-shaped notch 787 equally spaced from the vertical projections of neighboring porous columns 789. For further details of the porous structure 780 reference is made to the description of FIGS. 1A to 9C.

Figure 11A:
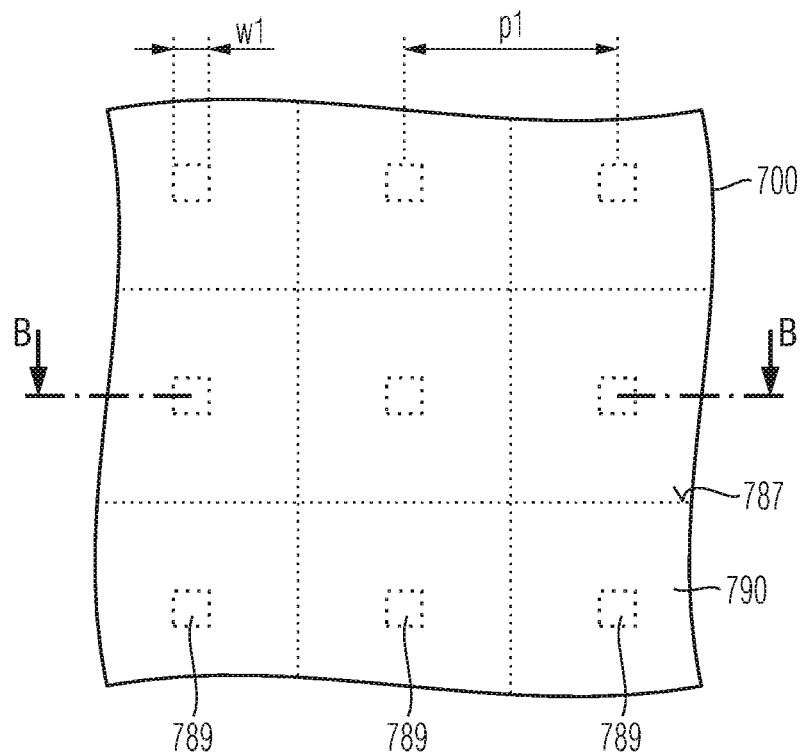
FIG. 11A is a schematic horizontal cross-sectional view of a portion of a semiconductor substrate according to an embodiment related to a buried porous structure with porous columns and a buried oxide layer.
Figure 11B:
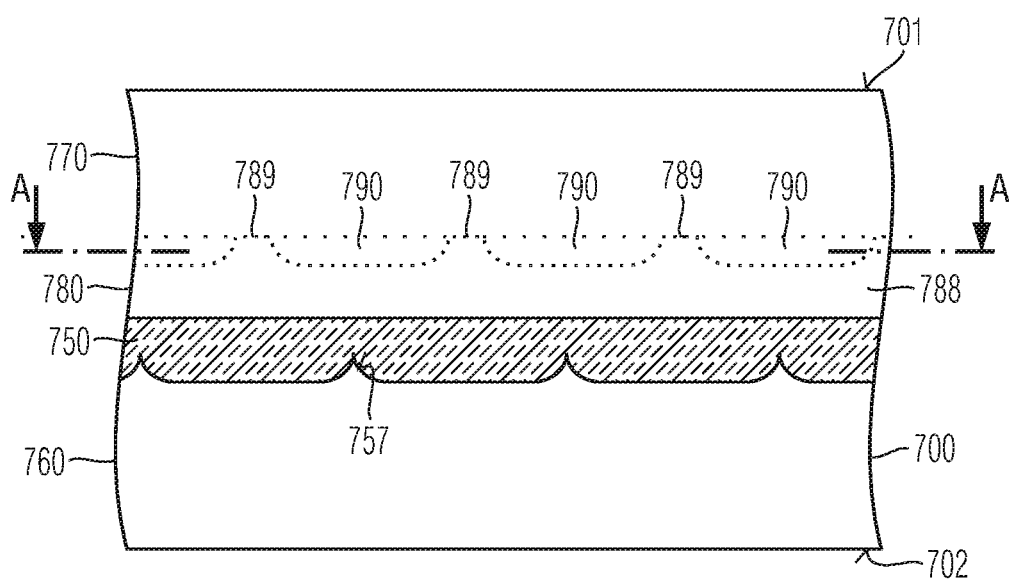
FIG. 11B is a schematic vertical cross-sectional view of the semiconductor substrate portion of FIG. 11A along line B-B.

FIGS. 11A to 11B illustrate a semiconductor substrate 700 including a buried oxide layer 750 between a porous structure 780 and a base portion 760 of the semiconductor substrate 700 between the buried oxide layer 750 and a rear side surface 702. A density or porosity of the buried oxide layer 750 may increase with decreasing distance to the main surface 701.

An interface between the porous structure 780 and the buried oxide layer 750 may be mainly parallel to the main surface 701. At the side oriented to the rear side surface 702, the buried oxide layer 750 may include a grid-shaped indentation 757 which is laterally equally spaced to the vertical projections of the porous columns 789 and which may be filled with the non-porous single-crystalline semiconductor material of the non-porous base portion 760. For further details of the porous structure 780 and the oxide layer 750 reference is made to the description of FIGS. 1A to 10B.

Figure 12A:
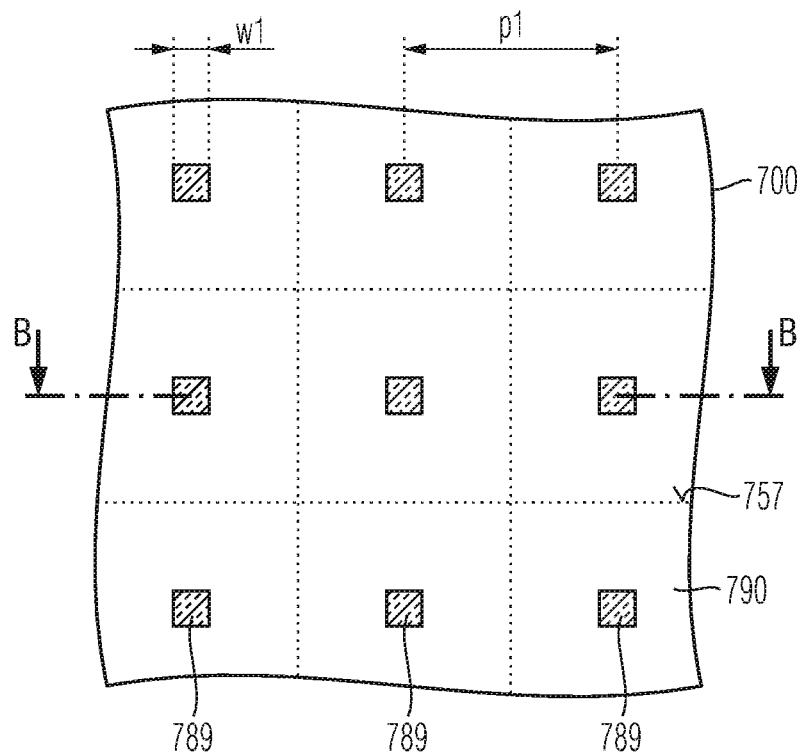
FIG. 12A is a schematic horizontal cross-sectional view of a portion of a semiconductor substrate according to an embodiment related to a buried oxide layer with porous columns.
Figure 12B:
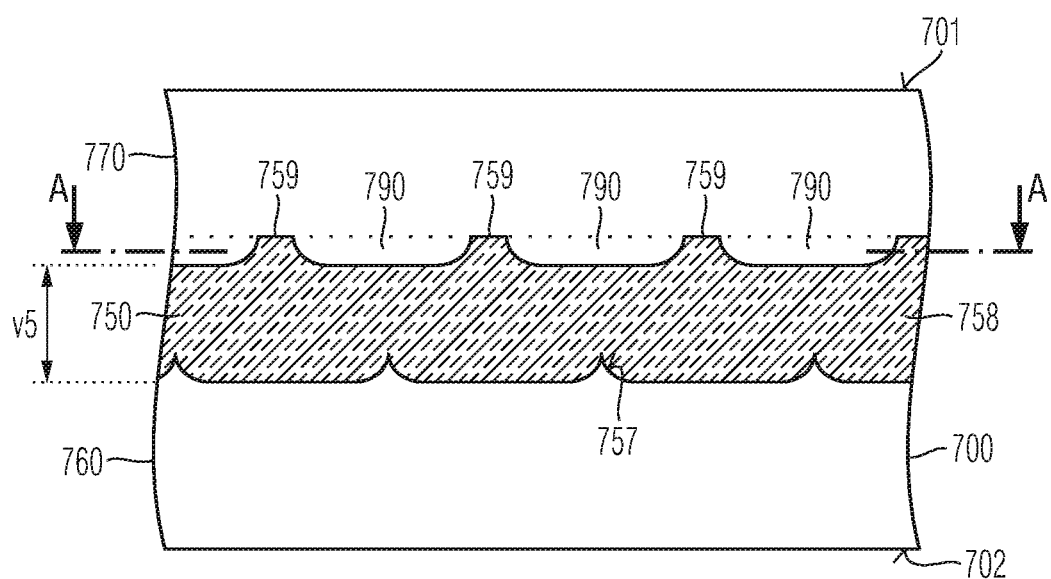
FIG. 12B is a schematic vertical cross-sectional view of the semiconductor substrate portion of FIG. 12A along line B-B.

FIGS. 12A to 12B relate to a buried oxide layer 750 spaced from both the main surface 701 and a rear side surface 702 of the semiconductor substrate 700. At a side oriented to the main surface 701 the buried oxide layer 750 may include column sections 759 protruding into direction of the main surface 701. A grid-shaped non-porous portion 790 laterally embeds the column sections 759. At a side oriented to the rear side surface 702 the buried oxide layer 750 may include a grid-shaped indentation 757. A vertical extension v5 of the oxide layer 750 may be in a range from 100 nm to 5 μm, e.g., in a range from 0.5 μm to 1 μm.

Semiconductor devices formed from semiconductor substrates as described above may include at least a portion of a porous structure formed according to the methods described herein.

Figure 13A:
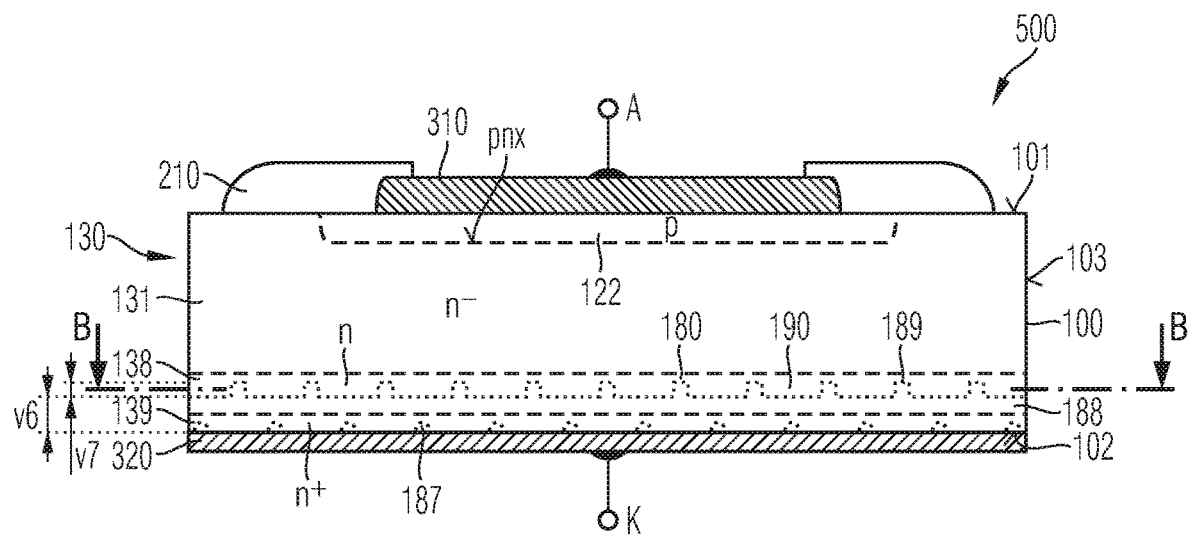
FIG. 13A is a schematic vertical cross-sectional view of a semiconductor device including a porous structure according to an embodiment related to a semiconductor diode.
Figure 13B:
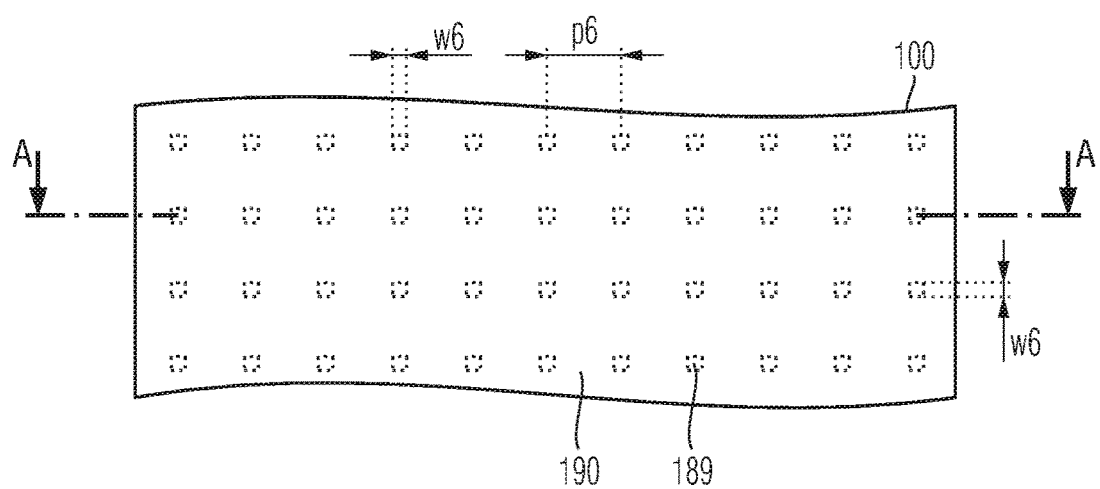
FIG. 13B is a schematic horizontal cross-sectional view of the semiconductor device portion of FIG. 13A along line B-B.

In FIGS. 13A and 13B the semiconductor device 500 is a power semiconductor diode with a semiconductor portion 100 made of silicon carbide. For example, the semiconductor portion 100 may be based on silicon (Si), germanium (Ge) or a compound semiconductor such as SiC, e.g. 4H-SiC (SiC of the 4H-polytype), 2H-SiC, 6H-SiC or 15R-SiC. A first surface 101 of the semiconductor portion 100 at the front side is parallel to an opposite second surface 102 on the back.

A drift structure 130 directly adjoins the second surface 102. The drift structure 130 may include a lightly doped drift zone 131 and a heavily doped contact portion 139 between the drift zone 131 and the second surface 102, wherein the contact portion 139 has the same conductivity type as the drift zone 131.

The drift structure 130 may be electrically connected or coupled to a second load electrode 320 that directly adjoins the second surface 102 through a low-resistive contact. For example, a dopant concentration in the contact portion 139 along the second surface 102 is sufficiently high to form a low-resistive contact with the second load electrode 320. The second load electrode 320 forms or is electrically connected or coupled to a cathode terminal K of the semiconductor diode.

The drift structure 130 may include further doped regions between the drift zone 131 and the first surface 101 and between the drift zone 131 and the second surface 102, for example, a buffer or field stop layer 138 between the drift zone 131 and the contact portion 139.

In a central region of the semiconductor device 500, an anode region 122 forms a main pn junction pnx with the drift structure 130, for example, with the drift zone 131. The main pn junction pnx may be parallel to the first surface 101. A first load electrode 310 directly adjoins the anode region 122 and may form or may be electrically connected or coupled to an anode terminal A. A dielectric layer 210 may cover sidewalls of the first load electrode 310. A termination structure may be formed between the central region and a side surface 103 of the semiconductor portion 100.

The semiconductor portion 100 includes a porous portion 180 including a layer portion 188 and a plurality of laterally separated column portions 189 extending from the layer portion 188 in direction of the first surface 101. The porous portion 180 may exclusively overlap with the contact portion 139, may overlap with the buffer or field stop layer 138 or may overlap with the drift zone 131.

A vertical extension v6 of the layer portion 188 may be in a range from 100 nm to 10 μm, for example from 500 nm to 5 μm. A vertical extension v7 of the column portions 189 may in the range of some nanometers. A mean center-to-center distance p6 between neighboring column portions 189 may be in a range from 200 nm to 5 μm. A maximum horizontal width w6 of the column portions 189 may be in a range from 100 nm to 2 μm.

The porous layer portion 188 may include a grid-shaped groove 187 at the rear side, wherein center of meshes of the grid-shaped groove 187 are in a vertical projection of the porous column portions 189. The grid-shaped groove 187 may be filled with non-porous single-crystalline semiconductor material, by way of example.

The porous portion 180 may reduce mechanical stress between the heavily doped contact portion and the drift zone 131, may provide getter sites for impurities, e.g., metal atoms and/or may be used to tune device parameters such as short-circuit ruggedness. Alternatively or in addition the porous portion 180 may locally increase a charge carrier recombination rate for improving switching characteristics of a semiconductor device, e.g., of an IGBT and/or may improve adhesion between the semiconductor portion 100 and the second load electrode 320.

Figure 14A:
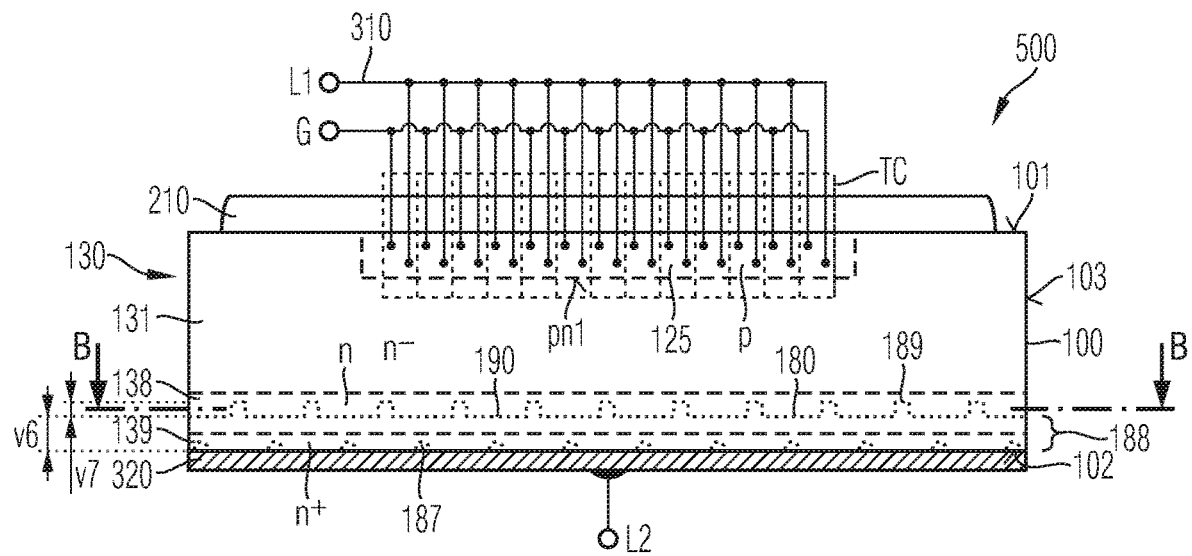
FIG. 14A is a schematic vertical cross-sectional view of a semiconductor device including a porous structure according to an embodiment related to a semiconductor device including transistor cells.
Figure 14B:
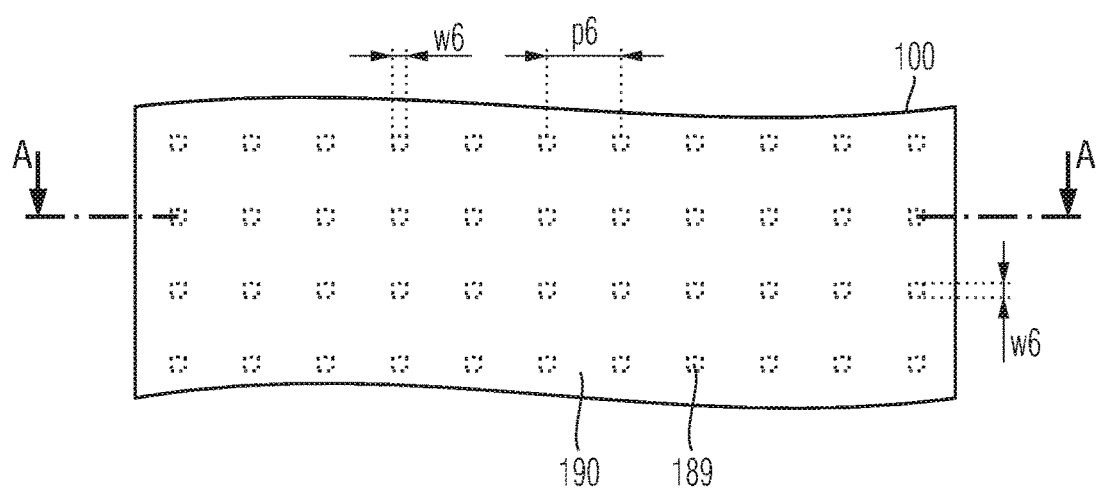
FIG. 14B is a schematic horizontal cross-sectional view of the semiconductor device portion of FIG. 14A along line B-B.

FIGS. 14A and 14B show a semiconductor device 500 including transistor cells TC. The semiconductor device 500 may be, for example, an IGFET (insulated gate field effect transistor), an IGBT (insulated gate bipolar transistor) or an MCD (MOS controlled diode). As regards details of the semiconductor portion 100, the drift structure 130, and the porous portion 180 reference is made to the description of the semiconductor diode in FIGS. 13A and 13B.

Instead of an anode region, the semiconductor device 500 of FIGS. 14A and 14B includes transistor cells TC, wherein in each transistor cell TC a body region 125 separates a source region from the drift structure 130. The body regions 125 form first transistor pn junctions pn1 with the drift structure 130, e.g., with the drift zone 131. The body regions 125 form second transistor pn junctions with the source zones.

A first load electrode 310 electrically connected to the body regions 125 and the source regions of the transistor cells TC may form or may be electrically connected or coupled to a first load terminal L1, which may be an anode terminal of an MCD, a source terminal of an IGFET or an emitter terminal of an IGBT.

A second load electrode 320 electrically connected to the contact portion 139 may form or may be electrically connected or coupled to a second load terminal L2, which may be a cathode terminal of an MCD, a drain terminal of an IGFET or a collector terminal of an IGBT.

The transistor cells TC may be transistor cells with planar gate electrodes or with trench gate electrodes, wherein the trench gate electrodes may control a lateral channel or a vertical channel. According to an embodiment, the transistor cells TC are n-channel FET cells with p-doped body regions 125, n-doped source zones and an n-doped drift zone 131.

Figure 15A:
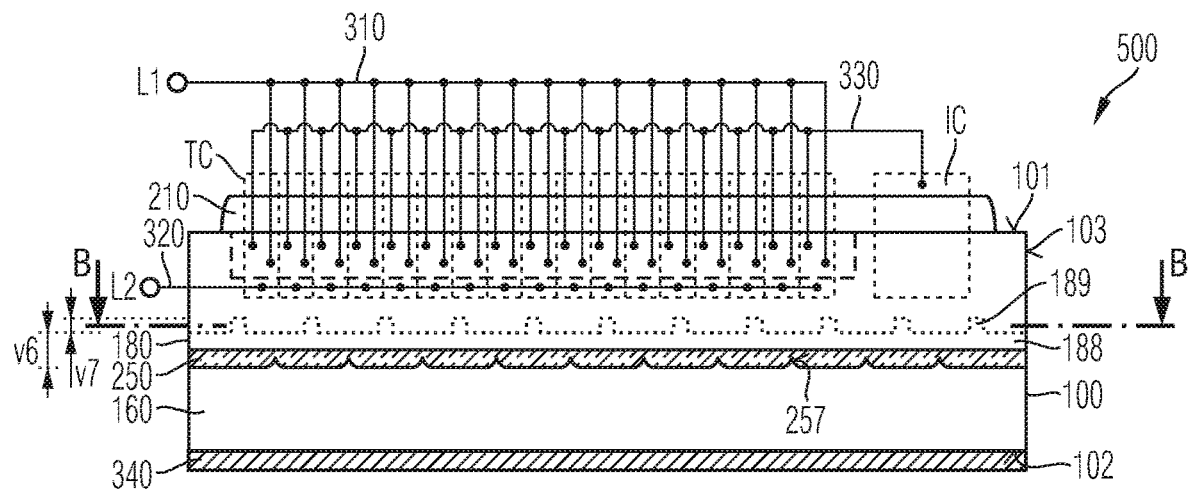
FIG. 15A is a schematic vertical cross-sectional view of a semiconductor device including a porous structure and a buried oxide layer according to an embodiment related to a semiconductor device including logic circuits.
Figure 15B:
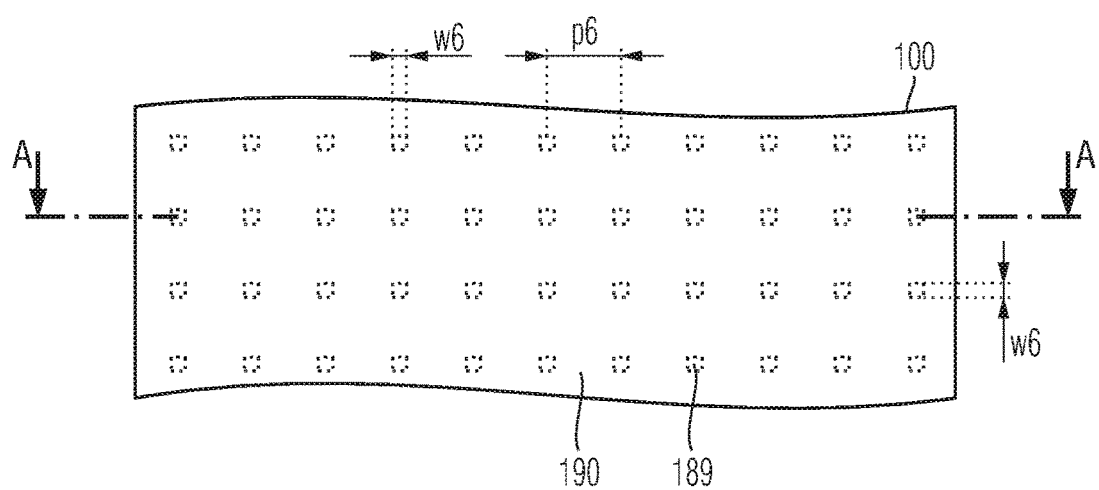
FIG. 15B is a schematic horizontal cross-sectional view of the semiconductor device portion of FIG. 15A along line B-B in FIG. 15A.

FIGS. 15A and 15B relate to an SOI semiconductor device 500, e.g., a CMOS (complementary metal oxide semiconductor) device. According to the illustrated embodiment, the SOI semiconductor device 500 is a smart power device including both a plurality of parallel transistor cells TC and logic/driver circuits IC, wherein a gate wiring 330 may electrically connect the gate electrodes of the transistor cells TC with an output stage of one of the logic/driver circuits IC.

A semiconductor portion 100 of the SOI semiconductor device 500 includes a porous portion 180 including a layer portion 188 and a plurality of laterally separated column portions 189 extending from the layer portion 188 in direction of the first surface 101.

A buried oxide region 250 forms a mainly horizontal interface with a bottom side of the porous portion 180. A low-resistive or high-resistive semiconductor base body 160 may be formed between the buried oxide region 250 and an auxiliary metallization 340 at the rear side. The buried oxide region 250 may include a dense bottom portion along the semiconductor base body 160 and a less dense portion at the side oriented to the first surface 101. At the side oriented to the second surface 102, the buried oxide region 250 may include a grid-shaped recess 257 which is laterally equally spaced to the vertical projections of the column portions 189 and which may be filled with non-porous single-crystalline semiconductor material of the semiconductor base body 160. For further details of the porous portion 180 and the buried oxide region 250 reference is made to the description of FIGS. 1A to 11B.

Figure 16A:
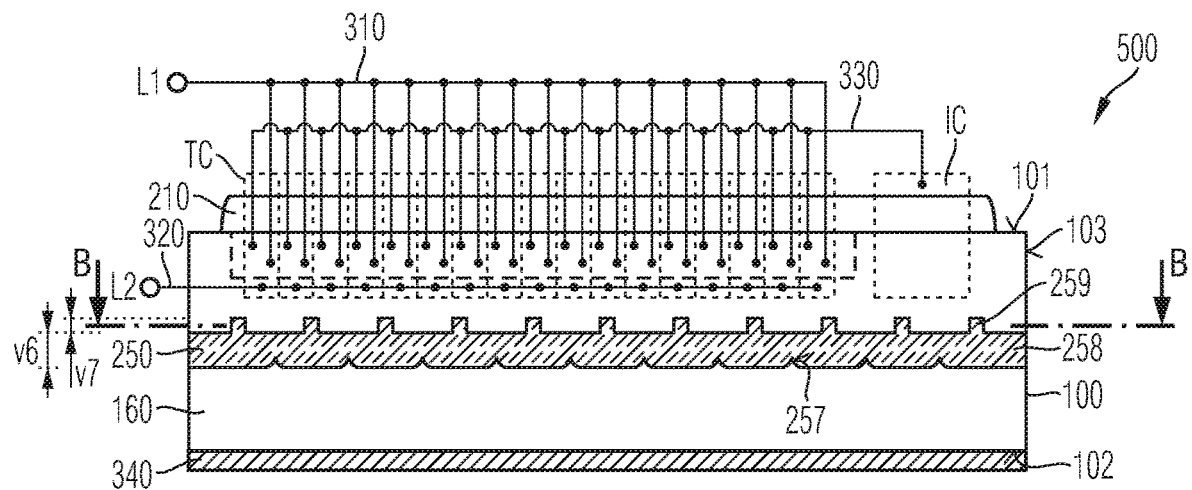
FIG. 16A is a schematic vertical cross-sectional view of a semiconductor device including a buried oxide layer and without a porous structure according to an embodiment related to a semiconductor device including logic circuits.
Figure 16B:
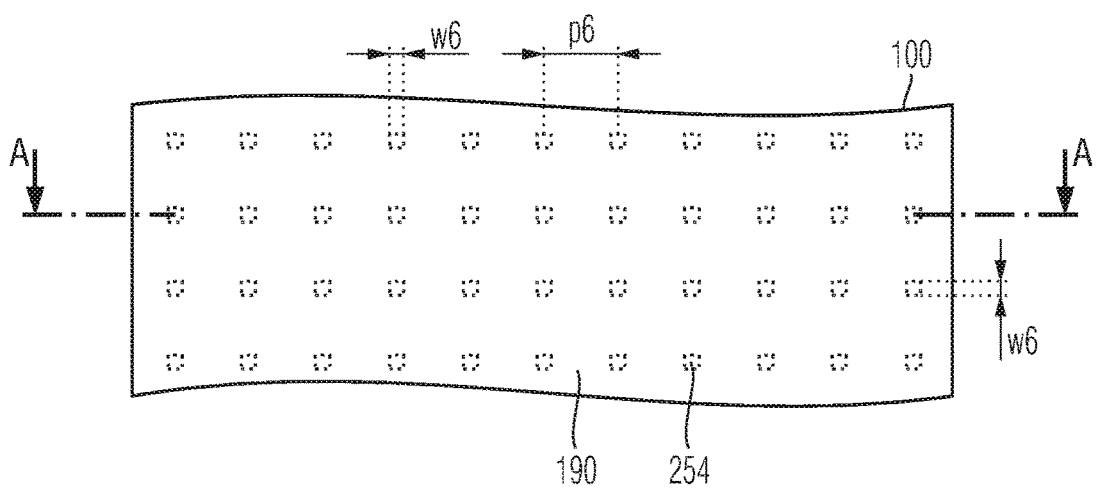
FIG. 16B is a schematic horizontal cross-sectional view of the semiconductor device portion of FIG. 16A along line B-B in FIG. 16A.

FIGS. 16A and 16B show another SOI semiconductor device 500 with a buried oxide region 250 that includes oxide columns 259 protruding from an oxide layer section 258 into direction of the first surface 101. A grid-shaped non-porous section of the semiconductor portion 100 laterally embeds the column oxide columns 259. At a side oriented to the second surface 102 the buried oxide region 250 may include a grid-shaped recess 257 which is laterally equally spaced to the vertical projections of the oxide columns 259 and which may be filled with non-porous single-crystalline semiconductor material. For further details of the buried oxide region 250 reference is made to the description of FIGS. 1A to 12B.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of manufacturing a semiconductor device, the method comprising:
   forming an auxiliary mask comprising a plurality of mask openings on a main surface of a crystalline semiconductor substrate;
   forming a porous structure in the semiconductor substrate, the porous structure comprising a porous layer at a distance to the main surface and porous columns protruding from the porous layer into a direction of the main surface and laterally separated from each other by a non-porous portion; and
   forming a non-porous device layer on the non-porous portion and on the porous columns,
   wherein forming the non-porous device layer comprises a heat treatment in an atmosphere containing hydrogen to form a non-porous crystalline starting layer.

2. The method of claim 1, further comprising:
   thinning the semiconductor substrate from a rear side opposite to the main surface; and
   stopping the thinning in response to detection of exposure of the porous structure.

3. The method of claim 2, further comprising:
   selectively removing the porous structure.

4. The method of claim 1, wherein forming the non-porous device layer comprises forming a main layer on the non-porous starting layer by epitaxy.

5. The method of claim 1, further comprising:
   forming an oxide layer from at least a bottom section of the porous structure.

6. The method of claim 5, wherein the oxide layer is formed partly in a non-porous base portion between the porous structure and a side of the non-porous base portion opposite to the main surface.

7. The method of claim 5, wherein a first portion of the oxide layer is formed at expense of a non-porous base portion between the porous structure and a side of the non-porous base portion opposite to the main surface, and a second portion of the oxide layer is formed from a portion of the porous structure, wherein a density of the first portion is higher than that of the second portion.

8. The method of claim 5, wherein forming the oxide layer comprises at least one of anodic oxidation and thermal oxidation.

9. The method of claim 5, wherein the porous columns are converted into column sections of the oxide layer.

10. The method of claim 9, wherein forming the non-porous device layer comprises epitaxial growth, and wherein the column sections of the oxide layer are laterally overgrown.

11. The method of claim 5, further comprising:
    thinning the semiconductor substrate from a rear side opposite to the main surface; and
    stopping the thinning in response to exposure of the oxide layer.

12. The method of claim 11, further comprising:
    selectively removing the oxide layer.

13. The method of claim 1, wherein the mask openings form a regular pattern.

14. The method of claim 1, wherein a cross-sectional area of the mask openings is at most 25 $\mu m^2$.

15. The method of claim 1, wherein a center-to-center distance of the mask openings is at most 10 $\mu m$.

16. The method of claim 1, wherein an area ratio of the mask openings to the main surface is at most 1:2.

17. The method of claim 1, wherein the auxiliary mask forms a grid or a plurality of regularly arranged grids.

18. The method of claim 1, wherein the porous structure is formed by anodization.

19. The method of claim 1, further comprising:
    forming an auxiliary layer on a base substrate to form the semiconductor substrate,
    wherein the auxiliary layer and the base substrate form a junction and an exposed surface of the auxiliary layer forms the main surface of the semiconductor substrate, wherein the junction is one of a pn junction, a $n^{++}/n^-$ junction and a $p^{++}/p^-$ junction.

20. The method of claim 19, further comprising:
forming doped columns of a conductivity type of the base substrate in the vertical projection of the mask openings,
wherein the doped columns extend from the main surface to the junction.

21. The method of claim 1, wherein the porous structure includes a plurality of laterally separated island portions.

22. A semiconductor substrate, comprising:
a porous layer at a distance to a main surface of the semiconductor substrate;
porous columns extending from the porous layer in a direction of the main surface; and
a non-porous portion laterally separating the porous columns from each other,
wherein the porous layer comprises a grid-shaped notch at a side of the porous layer opposite to the main surface,
wherein meshes of the grid-shaped notch are laterally centered between the porous columns.

23. The semiconductor substrate of claim 22, further comprising:
an oxide layer between the porous layer and a rear side of the semiconductor substrate opposite to the main surface, the oxide layer adjoining the porous layer.

24. The semiconductor substrate of claim 23, wherein the oxide layer comprises a grid-shaped indentation at a side of the oxide layer opposite to the main surface, and wherein meshes of the grid-shaped indentation are laterally centered between the porous columns.

25. The semiconductor substrate of claim 22, wherein a cross-sectional area of the porous columns is at most 25 µm².

26. A semiconductor device, comprising:
a porous layer portion at a distance to a main surface of a semiconductor portion; and
porous column portions extending from the porous layer portion in a direction of the main surface,
wherein the porous column portions are laterally separated from each other,
wherein the porous layer portion comprises a grid-shaped groove at a side of the porous layer portion opposite to the main surface,
wherein meshes of the grid-shaped groove are centered between the porous column portions.

27. A method of manufacturing a semiconductor device, the method comprising:
forming an auxiliary mask comprising a plurality of mask openings on a main surface of a crystalline semiconductor substrate;
forming a porous structure in the semiconductor substrate, the porous structure comprising a porous layer at a distance to the main surface and porous columns protruding from the porous layer into a direction of the main surface and laterally separated from each other by a non-porous portion;
forming a non-porous device layer on the non-porous portion and on the porous columns; and
forming an oxide layer from at least a bottom section of the porous structure.

28. The method of claim 27, wherein the oxide layer is formed partly in a non-porous base portion between the porous structure and a side of the non-porous base portion opposite to the main surface.

29. The method of claim 27, wherein a first portion of the oxide layer is formed at expense of a non-porous base portion between the porous structure and a side of the non-porous base portion opposite to the main surface, and a second portion of the oxide layer is formed from a portion of the porous structure, wherein a density of the first portion is higher than that of the second portion.

30. The method of claim 27, wherein forming the oxide layer comprises at least one of anodic oxidation and thermal oxidation.

31. The method of claim 27, wherein the porous columns are converted into column sections of the oxide layer.

32. The method of claim 31, wherein forming the non-porous device layer comprises epitaxial growth, and wherein the column sections of the oxide layer are laterally overgrown.

33. The method of claim 27, further comprising:
thinning the semiconductor substrate from a rear side opposite to the main surface; and
stopping the thinning in response to exposure of the oxide layer.

34. The method of claim 33, further comprising:
selectively removing the oxide layer.

35. A method of manufacturing a semiconductor device, the method comprising:
forming an auxiliary mask comprising a plurality of mask openings on a main surface of a crystalline semiconductor substrate;
forming a porous structure in the semiconductor substrate, the porous structure comprising a porous layer at a distance to the main surface and porous columns protruding from the porous layer into a direction of the main surface and laterally separated from each other by a non-porous portion; and
forming a non-porous device layer on the non-porous portion and on the porous columns,
wherein the auxiliary mask forms a grid or a plurality of regularly arranged grids.

36. A method of manufacturing a semiconductor device, the method comprising:
forming an auxiliary mask comprising a plurality of mask openings on a main surface of a crystalline semiconductor substrate;
forming a porous structure in the semiconductor substrate, the porous structure comprising a porous layer at a distance to the main surface and porous columns protruding from the porous layer into a direction of the main surface and laterally separated from each other by a non-porous portion;
forming a non-porous device layer on the non-porous portion and on the porous columns; and
forming an auxiliary layer on a base substrate to form the semiconductor substrate,
wherein the auxiliary layer and the base substrate form a junction and an exposed surface of the auxiliary layer forms the main surface of the semiconductor substrate,
wherein the junction is one of a pn junction, a $n^{++}/n^-$ junction and a $p^{++}/p^-$ junction.

37. The method of claim 36, further comprising:
forming doped columns of a conductivity type of the base substrate in the vertical projection of the mask openings,
wherein the doped columns extend from the main surface to the junction.

38. A semiconductor substrate, comprising:
a porous layer at a distance to a main surface of the semiconductor substrate;
porous columns extending from the porous layer in a direction of the main surface;
a non-porous portion laterally separating the porous columns from each other; and an oxide layer between the porous layer and a rear side of the semiconductor substrate opposite to the main surface, the oxide layer adjoining the porous layer.

39. The semiconductor substrate of claim 38, wherein the oxide layer comprises a grid-shaped indentation at a side of the oxide layer opposite to the main surface, and wherein meshes of the grid-shaped indentation are laterally centered between the porous columns.

* * * * *

UNITED STATES PATENT AND TRADEMARK OFFICE
CERTIFICATE OF CORRECTION

PATENT NO. : 10,714,377 B2  
APPLICATION NO. : 16/122456  
DATED : July 14, 2020  
INVENTOR(S) : I. Muri et al.

Page 1 of 1

It is certified that error appears in the above-identified patent and that said Letters Patent is hereby corrected as shown below:

On the Title Page

In The Abstract Column 2 (Line 7), please change "into direction" to -- into a direction --.

Signed and Sealed this  
Twenty-fifth Day of August, 2020

Andrei Iancu  
*Director of the United States Patent and Trademark Office*